US011405004B2

(12) United States Patent
Jafri et al.

(10) Patent No.: US 11,405,004 B2
(45) Date of Patent: Aug. 2, 2022

(54) LOW-POWER APPROXIMATE DPD ACTUATOR FOR 5G-NEW RADIO

(71) Applicant: Telefonaktiebolaget LM Ericsson (publ), Stockholm (SE)

(72) Inventors: Asad Jafri, Malmö (SE); Jessica Chani, Malmö (SE); Kristian Eklund, Dalby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/972,933

(22) PCT Filed: Jun. 5, 2018

(86) PCT No.: PCT/EP2018/064727
§ 371 (c)(1),
(2) Date: Dec. 7, 2020

(87) PCT Pub. No.: WO2019/233558
PCT Pub. Date: Dec. 12, 2019

(65) Prior Publication Data
US 2021/0328555 A1    Oct. 21, 2021

(51) Int. Cl.
*H03F 1/32* (2006.01)
*H04B 1/04* (2006.01)
*H04L 27/36* (2006.01)

(52) U.S. Cl.
CPC ......... *H03F 1/3247* (2013.01); *H03F 1/3252* (2013.01); *H03F 1/3258* (2013.01);
(Continued)

(58) Field of Classification Search
CPC .... H03F 1/3247; H04B 1/0475; H04L 27/368
(Continued)

(56) References Cited

U.S. PATENT DOCUMENTS 5,528,532 A * 6/1996 Shibutani ............. H03F 1/3241
708/801
2004/0208259 A1  10/2004 Hunton
(Continued)

FOREIGN PATENT DOCUMENTS

WO    2016203294 A1    12/2016
WO    2019233555 A1    12/2019

OTHER PUBLICATIONS

Hashemi, Soheil, et al., "DRUM: A Dynamic Range Unbiased Multiplier for Approximate Applications," IEEE/ACM International Conference on Computer-Aided Design (ICCAD), Austin, TX, 2015, pp. 418-425.
(Continued)

*Primary Examiner* — Kevin M Burd
(74) *Attorney, Agent, or Firm* — Withrow & Terranova, PLLC

(57) ABSTRACT

Systems and methods are disclosed herein for providing efficient Digital Predistortion (DPD). In some embodiments, a system comprises a DPD system comprising a DPD actuator. The DPD actuator comprises a Look-Up Table (LUT), selection circuitry, and an approximate multiplication function. Each LUT entry comprises information that represents a first set of values $\{p_1, p_2, \ldots, p_k\}$ and a second set of values $\{s_1, s_2, \ldots, s_k\}$ that represent a LUT value of $s_1 \cdot 2^{P_1} + s_2 \cdot 2^{P_2} + \ldots + s_k \cdot 2^{P_k}$ where each value $s_i \in \{+1, -1\}$ where $k \geq 2$. The selection circuitry is operable to, for each input sample of an input signal, select a LUT entry based on a value derived from the input sample that is indicative of a power of the input signal. The approximate multiplication function comprises shifting and combining circuitry that operates to, for each input sample, shift and combine bits that form a binary representation of the input sample in
(Continued)

accordance with $\{p_1, p_2, \ldots, p_k\}$ and $\{s_1, s_2, \ldots, s_k\}$ to provide an output sample.

21 Claims, 12 Drawing Sheets

(52) U.S. Cl.
CPC .............. *H04B 1/04* (2013.01); *H04B 1/0475* (2013.01); *H04L 27/368* (2013.01); *H03F 2201/3209* (2013.01); *H03F 2201/3212* (2013.01); *H03F 2201/3224* (2013.01); *H03F 2201/3233* (2013.01); *H04B 2001/0425* (2013.01)

(58) Field of Classification Search
USPC ........................................................ 375/297
See application file for complete search history.

(56) References Cited

U.S. PATENT DOCUMENTS

| | | |
|---|---|---|
| 2005/0001676 A1 | 1/2005 | Saed |
| 2010/0035554 A1 | 2/2010 | Ba et al. |
| 2014/0122554 A1 | 5/2014 | Hickmann et al. |
| 2015/0095394 A1 | 4/2015 | Finchelstein et al. |
| 2015/0381216 A1 | 12/2015 | Shor et al. |
| 2015/0381220 A1 | 12/2015 | Gal |
| 2016/0204809 A1 | 7/2016 | Pratt et al. |
| 2016/0295219 A1 | 10/2016 | Ye et al. |
| 2018/0367174 A1* | 12/2018 | Nakamura ........... H04B 1/0458 |

OTHER PUBLICATIONS

Morgan, Dennis R., et al., "A Generalized Memory Polynomial Model for Digital Predistortion of RF Power Amplifiers," IEEE Transactions on Signal Processing, vol. 54, No. 10, Oct. 2006, pp. 3852-3860.

Narayanamoorthy, Srinivasan, et al., "Energy-Efficient Approximate Multiplication for Digital Signal Processing and Classification Applications," IEEE Transactions on Very Large Scale Integration (VLSI) Systems, vol. 23, No. 6, Jun. 2015, pp. 1180-1184.

International Search Report and Written Opinion for International Patent Application No. PCT/EP2018/064705, dated Feb. 22, 2019, 10 pages.

International Search Report and Written Opinion for International Patent Application No. PCT/EP2018/064727, dated Feb. 25, 2019, 9 pages.

Examination Report for Indian Patent Application No. 202147000030, dated Jan. 3, 2022, 5 pages.

* cited by examiner

US 11,405,004 B2

LOW-POWER APPROXIMATE DPD ACTUATOR FOR 5G-NEW RADIO

TECHNICAL FIELD

The present disclosure relates to Digital Predistortion (DPD) to compensate for power amplifier non-linearities in a radio device.

BACKGROUND

Power Amplifiers (PAs) are the most dominant source of distortion in a radio system (Morgan et al., "A Generalized Memory Polynomial Model for Digital Predistortion of RF Power Amplifiers," IEEE Transactions on Signal Processing, Vol. 54, No. 10, pages 3852-3860, October 2006). Digital Predistortion (DPD) is a frequently used technique to compensate the power consumption of a PA. The DPD reduces the power/energy footprint by reducing nonlinear distortion introduced by PAs and enhances the power efficiency of the PA by allowing the PA to operate in its non-linear region. However, the digital pre-distorter itself consumes a major portion of power for the digital part. A typical digital pre-distorter is composed of a forward path and an adaptation path. In Third Generation Partnership (3GPP) Fifth Generation (5G) radios containing tens of PAs, the forward path is the main source of power since, firstly, the forward path has to be replicated for all PAs and, secondly, the forward path is always active. As such, there is a need for systems and methods for providing DPD in a manner that reduces power consumption.

SUMMARY

Systems and methods are disclosed herein for providing efficient Digital Predistortion (DPD). In some embodiments, a system comprises a DPD system for digitally predistorting an input signal to provide a predistorted output signal. The DPD system comprises a DPD actuator, where the DPD actuator comprises a Look-Up Table (LUT), selection circuitry, and an approximate multiplication function. The LUT comprises a plurality of LUT entries, where each LUT entry comprises information that represents a first set of values $\{p_1, p_2, \ldots p_k\}$ and a second set of values $\{s_1, s_2, \ldots, s_k\}$ that together represent a LUT value of $s_1 \cdot 2^{p_1} + s_2 \cdot 2^{p_2} + \ldots + s_k \cdot 2^{p_k}$ where each value $s_i \in \{+1, -1\}$ for all $i=1, 2, \ldots, k$ and $k \geq 2$. The selection circuitry is operable to, for each input sample of a plurality of input samples of the input signal, select a LUT entry from among the plurality of LUT entries comprised in the LUT based on a value derived from the input sample that is indicative of a power of the input signal. The approximate multiplication function comprises shifting and combining circuitry that operates to, for each input sample of the plurality of input samples of the input signal: for each value $p_i$ in the first set of values $\{p_1, p_2, \ldots, p_k\}$ for the selected LUT entry, shift a plurality of bits that form a binary representation of the input sample by $p_i$ bit positions to provide a respective shifted value; and combine the shifted values using additions and subtractions in accordance with signs defined by the second set of values $\{s_1, s_2, \ldots, s_k\}$ to thereby provide a binary representation of an output sample. In this manner, an efficient DPD actuator is provided.

In some embodiments, the DPD system further comprises an adaptor that operates to update the plurality of LUT entries in the LUT.

In some embodiments, the adaptor comprises a modification function and a LUT conversion function operable to generate a plurality of initial LUT values to be approximated by the information stored in the plurality of LUT entries, wherein the modification function is operable to approximate each of at least some input values of the LUT conversion function as either a power of 2 value or a combination of two or more power of 2 values.

In some embodiments, $k \geq 2$. In some other embodiments, $k=3$.

In some embodiments, the input signal is a complex signal having a real component and an imaginary component, and the plurality of input samples of the input signal is a plurality of input samples of the real component of the input signal or a plurality of input samples of the imaginary component of the input signal.

In some embodiments, the system further comprises transmitter circuitry operable to upconvert, filter, and amplify the output signal prior to transmission, wherein the DPD system operates to compensate for a non-linear characteristic of a Power Amplifier (PA) comprised in the transmitter circuitry.

In some embodiments, the adaptor comprises an adaptation function, a LUT conversion function, and an approximation function. The adaptation function is operable to compute a desired DPD characteristic based on a comparison of the input signal and a feedback signal, the feedback signal being from an output of a respective PA. The LUT conversion function is operable to, for each LUT entry, compute an initial LUT value for the LUT entry based on the desired DPD characteristic. The approximation function is operable to, for each LUT entry, compute the first set of values $\{p_1, p_2, \ldots, p_k\}$ and the second set of values $\{s_1, s_2, \ldots, s_k\}$ for the LUT entry such that $s_1 \cdot 2^{p_1} + s_2 \cdot 2^{p_2} + \ldots + s_k \cdot 2^{p_k}$ is an approximation of the initial LUT value for the LUT entry.

In some embodiments, the DPD actuator comprises a plurality of memory tap branches each comprising a separate LUT, a separate select circuitry, and a separate approximate multiplication function. Each output sample of the output signal is provided as a sum of output samples from the plurality of memory tap branches for a respective input sample of the input signal.

In some embodiments, the approximate multiplication function comprises a shifter, an adder/subtractor, and an accumulation register. The shifter, the adder/subtractor, and the accumulation register are controlled to generate and combine the shifted values in a serial manner in accordance with the first set of values $\{p_1, p_2, \ldots, p_k\}$ and the second set of values $\{s_1, s_2, \ldots, s_k\}$ for the selected LUT entry.

In some embodiments, the system is a transmitter of a radio node in a cellular communications network.

Embodiments of a method for digitally predistorting an input signal to provide a predistorted output signal are also disclosed. In some embodiments, a method for digitally predistorting an input signal to provide a predistorted output signal using a DPD actuator comprising a LUT comprising a plurality of LUT entries, wherein each LUT entry comprises information that represents a first set of values $\{p_1, p_2, \ldots, p_k\}$ and a second set of values $\{s_1, s_2, \ldots, s_k\}$ that together represent a LUT value of $s_1 \cdot 2^{p_1} + s_2 \cdot 2^{p_2} + \ldots + s_k \cdot 2^{p_k}$ where each value $s_i \in \{+1, -1\}$ for all $i=1, 2, \ldots, k$ and $k \geq 2$, is provided. The method comprises, for each input sample of a plurality of input samples of the input signal: selecting a LUT entry from among the plurality of LUT entries comprised in the LUT based on a value derived from the input sample that is indicative of a power of the input signal; for each value $p_i$ in the first set of values $\{p_1, p_2, \ldots, p_k\}$ for the selected LUT entry, shifting a plurality of bits that form a binary representation of the input sample by $p_i$ bit positions to provide a respective shifted value; and combining the shifted values using additions and subtractions in accordance with signs defined by the second set of values $\{s_i, s_2, \ldots, s_k\}$ to thereby provide a binary representation of an output sample that is an approximation of a multiplication of the input sample and a desired DPD value represented by the LUT entry.

In some embodiments, the method further comprises adapting the plurality of LUT entries in the LUT.

In some embodiments, adapting the plurality of LUT entries in the LUT comprises generating input values based on a feedback signal, approximating each of at least some of the input values as either a power of 2 value or a combination of two or more power of 2 values, and generating a plurality of initial LUT values to be approximated by the information stored in the plurality of LUT entries based on the at least some input values.

In some embodiments, $k \geq 2$. In some other embodiments, $k=3$.

In some embodiments, the input signal is a complex signal having a real component and an imaginary component, and the plurality of input samples of the input signal is a plurality of input samples of the real component of the input signal or a plurality of input samples of the imaginary component of the input signal.

In some embodiments, the method further comprises, in transmitter circuitry, upconverting, filtering, and amplifying the output signal prior to transmission, wherein the DPD actuator applies a predistortion that compensates for a non-linear characteristic of a PA comprised in transmitter circuitry.

In some embodiments, adapting the plurality of LUT entries in the LUT comprises computing a desired DPD characteristic based on a comparison of the input signal and a feedback signal, the feedback signal being from an output of a respective PA. Adapting the plurality of LUT entries in the LUT further comprises, for each LUT entry, computing an initial LUT value for the LUT entry based on the desired DPD characteristic and computing the first set of values $\{p_1, p_2, \ldots, p_k\}$ and the second set of values $\{s_1, s_2, \ldots, s_k\}$ for the LUT entry such that $s_1 \cdot 2^{p_1} + s_2 \cdot 2^{p_2} + \ldots + s_k \cdot 2^{p_k}$ is an approximation of the initial LUT value for the LUT entry.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Figure 1:
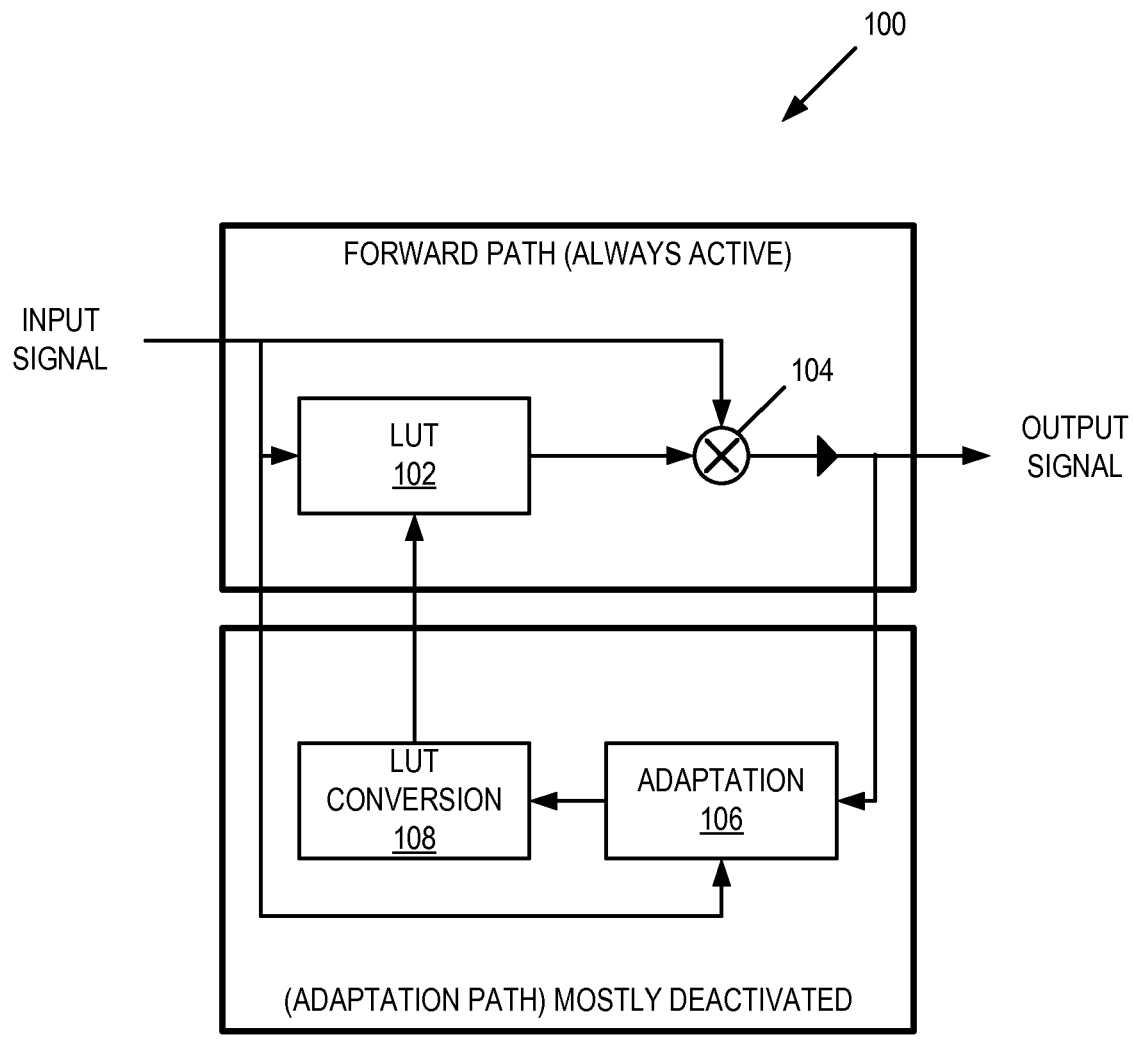
FIG. 1 illustrates one example of a present day Digital Predistortion (DPD) system.

Present day Digital Predistortion (DPD) systems use Look-Up Tables (LUTs) in the forward path to linearize a Power Amplifier (PA) to thereby reduce the Adjacent Channel Leakage Ratio (ACLR). This enables the PA to be operated in its non-linear region, which in turn enhances the efficiency of the PA. FIG. 1 illustrates one example of a present day DPD system 100. This DPD system 100 includes a forward path including a LUT 102 and a multiplier 104, and an adaptation path that includes an adaptation function 106 and a LUT conversion function 108. In operation, an input signal is received by the DPD system 100. For each sample of the input signal, a value derived from the sample of the input signal that is indicative of the power of the input signal (e.g., a magnitude squared of the sample of the input signal) is used as an address of the LUT 102. The addressed value in the LUT 102 is output to the multiplier 104 where it is multiplied together with the sample of the input signal to provide a respective sample of the output signal. This is repeated for each sample of the input signal. The resulting output signal is a predistorted version of the input signal. Note that, while not shown, the output signal of the DPD system 100 is fed to a respective PA. Also, to cater memory effects, a pre-distorter commonly has three to twenty taps, as will be appreciated by one of skill in the art. However, multiple taps are not shown in FIG. 1 for clarity and ease of discussion.

When the adaptation path is active, the adaptation function 106 and the LUT conversion function 108 operate together to populate the values in the LUT 102 to achieve the desired performance. More specifically, the adaptation function 106 compares the input signal and a feedback signal (e.g., an amplified version of the output signal from the output of a respective PA) and, based on this comparison, generates a desired predistortion characteristic. As an example, the adaptation function 106 may train the coefficients of an N-th order (e.g., third order, fourth order, fifth order, etc.) polynomial that defines the desired predistortion. The LUT conversion function 108 converts the output of the adaptation function 106 (e.g., the N-th order polynomial) into respective LUT values and stores those LUT values in the LUT 102. In this manner, the adaptation path populates the LUT 102.

In existing DPD systems, the multiplier 104 is a conventional multiplier (e.g., Booth Wallace multiplier). It is well known that these multipliers consume a significant amount of power and area. As a result of these multipliers, the conventional DPD system consumes a large amount of power. Due to the high power consumption, the conventional DPD system cannot be placed on the same chip with the PA due to excessive heating; instead, the DPD system is conventionally placed in the baseband processing unit with cooling. In general filter design domain, there are numerous works that reduce the power consumption by converting multiplications to shift and accumulate operations provided that one of the operands is a constant. However, they are not applicable to DPD since those techniques require that at least one of the operands is a constant.

Recently, 3GPP specification for NR has lowered the ACLR requirements. The proposed architecture exploits the lower ACLR requirements to save power in a DPD actuator (also called the forward path). In particular, a system and methods are disclosed herein that provide a solution for approximating multiplications using shift and accumulate operations in a DPD system (i.e., when neither of the operands is a constant). Simulations have shown that, theoretically, the solution presented herein saves 72% energy, saves 86% area, and has no additional memory costs. All this achieved at the cost of 2 decibels relative to the carrier (dBc) loss in ACLR, which is well within the range of the 5G 3GPP specification.

Systems and methods disclosed herein leverage the reduced ACLR requirements of 3GPP NR to reduce power consumption due to multipliers in the DPD system by replacing the conventional multipliers with circuitry that approximates multiplication using bit shifting operations. In particular, each LUT entry is represented by summation or subtraction of multiple powers of 2. The multiplier is then implemented by performing multiple bit shifting operations on a binary representation of the sample of the input signal and combining (e.g., adding and/or subtracting) the resulting bit-shifted versions of the sample of the input signal. In this manner, conventional multipliers are completely eliminated. Simulations have shown that, theoretically, a 72% reduction in dynamic energy can be achieved while maintaining the ACLR requirements of 3GPP. This reduction in power will allow, for example, the DPD system to be integrated with the radio on the same chip.

Figure 2:
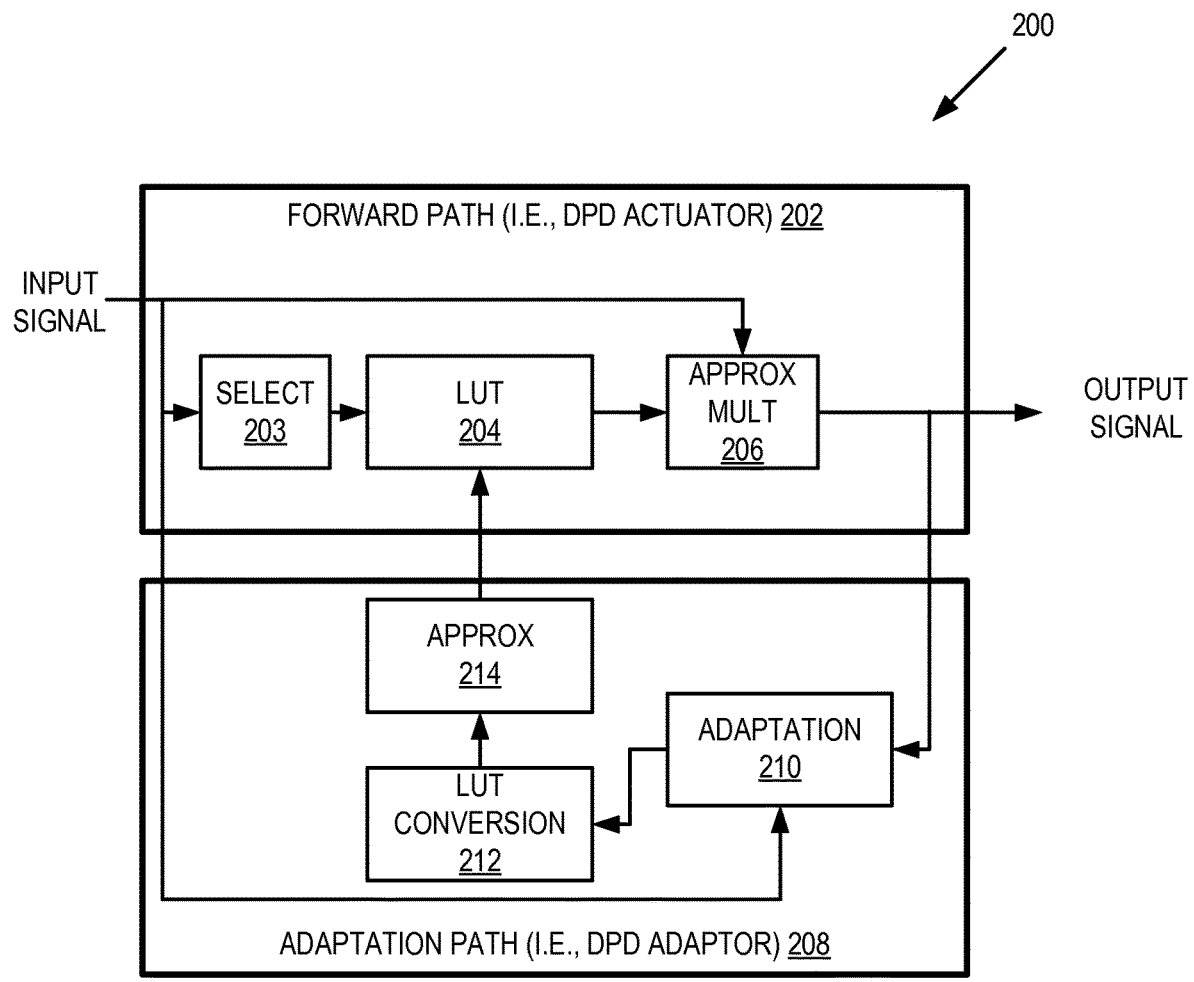
FIG. 2 illustrates a DPD system that utilizes approximate multiplication based on binary shift operations according to embodiments of the present disclosure.

In this regard, FIG. 2 illustrates a DPD system 200 according to embodiments of the present disclosure. Note that, for clarity and ease of discussion, the DPD system 200 is shown as a single tap system. However, as will be appreciated by one of ordinary skill in the art, the DPD system 200 may have multiple taps in order to compensate for memory effects. The DPD system 200 includes a forward path 202 including a select function 203 (also referred to herein as "selection circuitry"), a LUT 204, and an approximate multiplication function 206. The DPD system 200 also includes an adaptation path 208 that includes an adaptation function 210, a LUT conversion function 212, and an approximation function 214. Note that the select function 203, the LUT 204, and the approximate multiplication function 206 are also referred to herein as a "DPD actuator" or a "LUT-based DPD actuator." Similarly, the adaptation function 210, the LUT conversion function 212, and the approximation function 214 are also referred to herein as an "adaptor" or "DPD adaptor." As discussed below in detail, the approximate multiplication function 206 implements an approximation of a multiplication of a sample of the input signal and a desired predistortion value using k bit shift operations, where $k \geq 2$ and, more preferably, $k \geq 3$. In some preferred embodiments, k=3. Note that the approximate multiplication function 206 performs an actual multiplication of the sample of the input signal and an approximation of the desired predistortion value (represented by values stored in the indexed LUT entry) using k bit shift operations. As such, the approximate multiplication function 206 is said to perform an "approximate multiplication" of the desired predistortion value and the sample of the input signal. The LUT 204 has multiple LUT entries, each storing information that defines the k bit shift operations and the combinations (i.e., additions or subtractions) of the resulting bit-shifted values needed to approximate multiplication of the input signal by a desired predistortion value for a respective input signal power level. The select function 203 selects the LUT entry to be output by the LUT 204 to the approximate multiplication function 206 based on the input signal. More specifically, the LUT entries are preferably indexed by a value derived from the input sample that is indicative of a power of the input signal (e.g., a magnitude squared of sample of the input signal).

Note that the input signal and the output signal of the DPD system 200 are typically complex signals, where each sample of these signals includes a real component (I) and an imaginary component or quadrature component (Q). As such, each LUT entry preferably includes separate information for I and Q. In other words, in order to approximate a multiplication of two complex values (i.e., a complex value sample of the input signal and a complex value of the desired predistortion), each LUT entry in the LUT 204 may include: (a) first information that defines the bit-shifting operations and combinations of the resulting bit-shifted values needed to approximate a multiplication of either the real component or the imaginary component of the sample of the input signal and the real component of the desired predistortion and (b) second information that defines the bit-shifting operations and combinations of the resulting bit-shifted values needed to approximate a multiplication of either the real component or the imaginary component of the sample of the input signal and the imaginary component of the desired predistortion. In other words, the multiplication of a complex input sample $(I_{in}, Q_{in})$ and a respective complex DPD value $(I_{DPD}, Q_{DPD})$ can be expressed as:

$$(I_{in}+iQ_{in})\cdot(I_{DPD}+iQ_{DPD})=I_{in}I_{DPD}-Q_{in}Q_{DPD}+iI_{in}Q_{DPD}+iI_{DPD}Q_{in}.$$

Thus, in some embodiments, to approximate complex multiplication, each DPD actuator 202 includes four approximate multiplication functions 206 to generate the terms $I_{in}I_{DPD}$, $Q_{in}Q_{DPD}$, $I_{in}Q_{DPD}$, and $I_{DPD}Q_{in}$ using respective combinations of bit shifting operations in accordance with respective information stored in applicable LUT entry (i.e., a first set of power values and sign values for $I_{DPD}$ and a second set of power values and sign values for $Q_{DPD}$ in a manner similar to that described herein). For a particular complex input sample, the outputs of the four approximate multiplication functions 206 are combined in accordance with the equation above to provide the real and imaginary components of the output sample.

In the adaptation path 208, when activated, the adaptation function 210 performs any suitable adaptation scheme based on the input signal and a respective feedback signal from the output of a respective PA to compute a desired predistortion characteristic. As an example, the adaptation function 210 may train coefficients of an N-th order (e.g., third order, fourth order, fifth order, etc.) polynomial that defines the desired predistortion. The LUT conversion function 212 converts the output of the adaptation function 210 (e.g., the N-th order polynomial) into respective initial LUT values. Rather than storing these LUT values in the LUT 204, the approximation function 214 approximates each initial LUT value ($LUT_{INT}$) as:

$$LUT_{INT} \cong s_1 \cdot 2^{p_1} + s_2 \cdot 2^{p_2} + \ldots + s_k \cdot 2^{p_k}$$

where each value $s_i \in \{+1, -1\}$ for all $i=1, 2, \ldots, k$. The values $s_i$ are sign values that define whether the k values of 2 are to be added or subtracted. For each initial LUT value, the approximation function 214 then stores, in a respective entry in the LUT 204, information that represents a first set of values $\{p_1, p_2, \ldots, p_k\}$ and a second set of values $\{s_1, s_2, \ldots, s_k\}$ that together represent the approximation of the initial LUT value as $s_1 \cdot 2^{p_1} + s_2 \cdot 2^{p_2} + \ldots + s_k \cdot 2^{p_k}$. For example, the information in the LUT entry may include k variables that represent the first set of values $\{p_1, p_2, \ldots, p_k\}$ and k bits that represent the second set of values $\{s_1, s_2, \ldots, s_k\}$ (i.e., bit value of 1 represents $s_i=1$ and bit value of 0 represents $s_i=-1$).

In operation, the input signal is received by the DPD system 200. For each sample of the input signal, the select function 203 derives a value from the sample of the input signal that is indicative of the power of the input signal (e.g., a magnitude squared of the sample of the input signal). The value is used by the select function 203 to provide an address or index to the LUT 204 such that information from a corresponding entry of the LUT 204 is output to the approximate multiplication function 206. This information is used at the approximate multiplication function 206 to generate an approximation of a multiplication of the sample of the input signal and a desired predistortion value using bit-shifting operations. This process is repeated for each sample of the input signal. The resulting output signal is a predistorted version of the input signal. Note that, while not shown, the output signal of the DPD system 200 is fed to a respective PA.

When the adaptation path 208 is active, the adaptation function 210, the LUT conversion function 212, and the approximation function 214 operate together to populate the LUT entries in the LUT 204 to achieve the desired performance. More specifically, the adaptation function 210 compares the input signal and a feedback signal (e.g., an amplified version of the output signal from the output of a respective PA) and, based on this comparison, generates a desired predistortion characteristic. Again, as an example, the adaptation function 210 may train the coefficients of an N-th order (e.g., third order, fourth order, fifth order, etc.) polynomial that defines the desired predistortion. The LUT conversion function 212 converts the output of the adaptation function 210 (e.g., the N-th order polynomial) into respective initial LUT values. Again, the approximation function 214 then approximates each of the initial LUT values as a combination of k powers of 2 and stores the information that represents the resulting power values $\{p_1, p_2, \ldots, p_k\}$ and sign values $\{s_1, s_2, \ldots, s_k\}$ in the respective LUT entry.

A more detailed description of the operation of the approximate multiplication function 206 will now be provided. In general, assume that the sample of the input signal is X and the desired predistortion value is Y. This value of Y corresponds to the initial LUT value for the respective LUT entry. At the approximation function 214, Y is approximated as:

$$Y \cong s_1 \cdot 2^{p_1} + s_2 \cdot 2^{p_2} + \ldots + s_k \cdot 2^{p_k}.$$

Assuming a binary representation of X, a multiplication of X and Y can then be computed using k bit shifting operations on the binary representation of Y and combining the results. Specifically, the multiplication of X and Y can be computed as follows:

Shift bits of X by $p_1$ bit positions to get first bit-shifted value,

Shift bits of X by $p_2$ bit positions to get second bit-shifted value,

. . . ,

Shift bits of X by $p_k$ bit positions to get k-th bit-shifted value, and

Combine (i.e., add or subtract) the bit-shifted values in accordance with the respective sign values $s_1, s_2, \ldots, s_k$, where $s_i=1$ indicates addition and $s_i=-1$ indicates subtraction.

This processing may be performed serially (i.e., using a single bit shifter circuit to perform the bit-shifting operations serially) where accumulation is used to combine the bit-shifted values or performed in parallel (i.e., using k bit shifter circuits to perform the k bit-shifting operations in parallel) where addition/subtraction circuitry is then used to combine the bit-shifted values.

Figure 3:
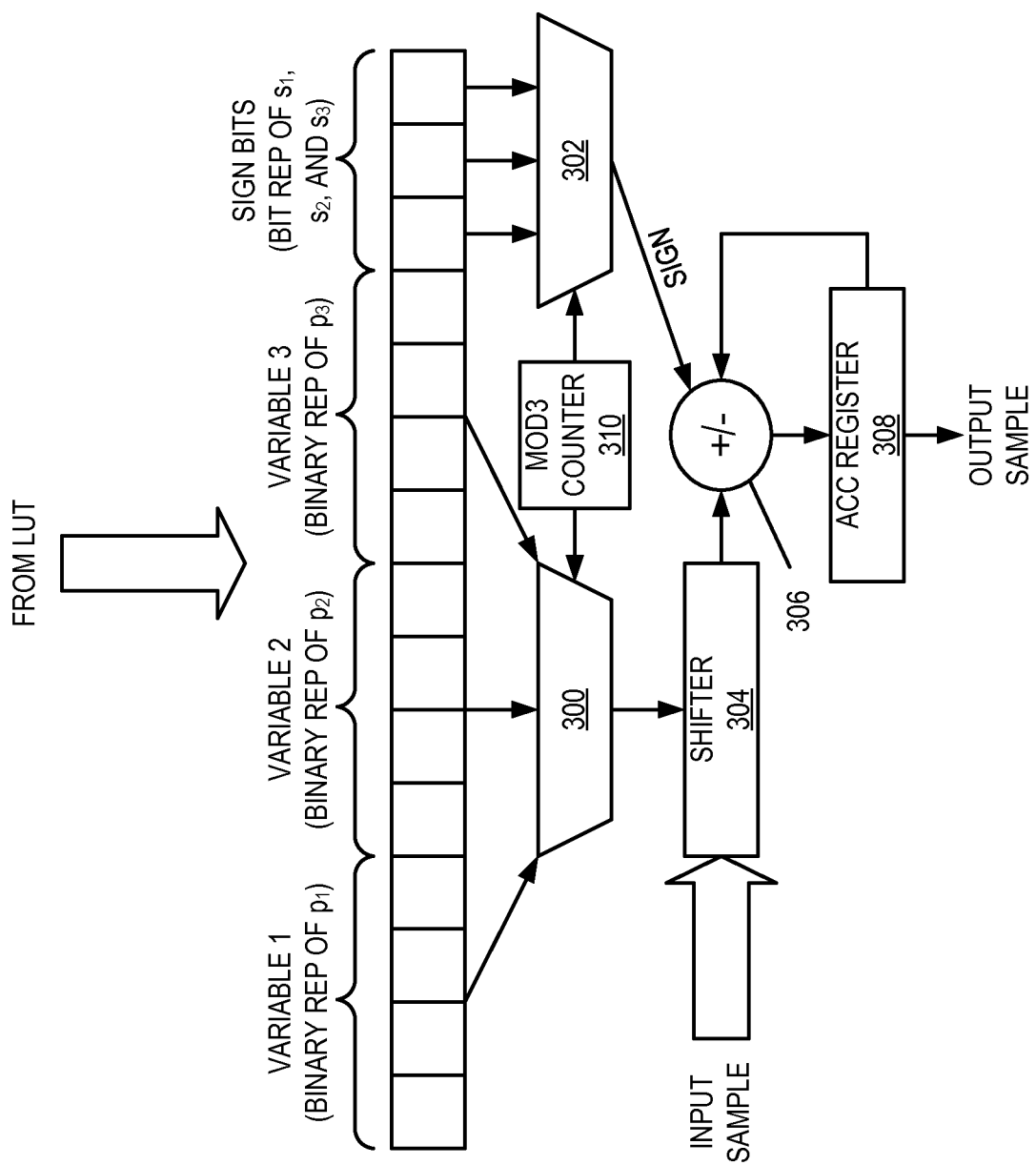
FIG. 3 illustrates one example embodiment of the approximate multiplication function of the DPD system of FIG. 2 for $k=3$ in which the bit-shifted values are computed serially and accumulated in accordance with some embodiments of the present disclosure.

In this regard, FIG. 3 illustrates one example embodiment of the approximate multiplication function 206 for k=3 in which the bit-shifted values are computed serially and accumulated. For clarity and ease of discussion, this example focuses on a scenario in which the input signal is a real signal.

As illustrated, the information from the appropriate LUT entry includes three variables, namely, a first variable that is a binary representation of $p_1$, a second variable that is a binary representation of $p_2$, and a third variable that is a binary representation of $p_3$. In addition, the information from the LUT entry includes a first bit that represents the value $s_1$, a second bit that represents the value $s_2$, and a third bit that represents the value $s_3$. The three variables representing the power values $p_1$, $p_2$, and $p_3$ are input to a first multiplexer 300, and the three bits representing the sign values $s_1$, $s_2$, and $s_3$ are input to a second multiplexer 302. A sample of the input signal (referred to herein as an input sample) is input to a shifter 304. The output of the shifter 304 is provided to an adder/subtractor 306 that either adds or subtracts the output of the shifter 304 to/from a current value in an accumulation register 308 in accordance with the output of the second multiplexer 302. A mod3 counter 310 controls outputs of the multiplexers 300 and 302.

In operation, a new input sample and the information from the respective LUT entry are provided to the approximate multiplication function 206. The accumulation register 308 is initialized to zero. In the first iteration, the first multiplexer 300 outputs the binary representation of $p_1$, and the second multiplexer 302 outputs the bit that represents $s_1$. The shifter 304 shifts the bits forming the binary representation of the input sample by $p_1$ bit positions to get a first bit-shifted value. If $s_1=1$ as represented by the corresponding bit in the LUT entry, the adder/subtractor 306 adds the first bit-shifted value to the current value in the accumulation register 308 and stores the result in the accumulation register 308. Conversely, if $s_1=-1$ as represented by the corresponding bit in the LUT entry, the adder/subtractor 306 subtracts the first bit-shifted value from the current value in the accumulation register 308 and stores the result in the accumulation register 308.

The mod3 counter 310 is incremented to then start the second iteration. In the second iteration, the first multiplexer 300 outputs the binary representation of $p_2$, and the second multiplexer 302 outputs the bit that represents $s_2$. The shifter 304 shifts the bits forming the binary representation of the input sample by $p_2$ bit positions to get a second bit-shifted value. If $s_2=1$ as represented by the corresponding bit in the LUT entry, the adder/subtractor 306 adds the second bit-shifted value to the current value in the accumulation register 308 and stores the result in the accumulation register 308. Conversely, if $s_2=-1$ as represented by the corresponding bit in the LUT entry, the adder/subtractor 306 subtracts the second bit-shifted value from the current value in the accumulation register 308 and stores the result in the accumulation register 308.

The mod3 counter 310 is again incremented to then start the third iteration. In the third iteration, the first multiplexer 300 outputs the binary representation of $p_3$, and the second multiplexer 302 outputs the bit that represents $s_3$. The shifter 304 shifts the bits forming the binary representation of the input sample by $p_3$ bit positions to get a third bit-shifted value. If $s_3=1$ as represented by the corresponding bit in the LUT entry, the adder/subtractor 306 adds the third bit-shifted value to the current value in the accumulation register 308 and stores the result in the accumulation register 308. Conversely, if $s_3=-1$ as represented by the corresponding bit in the LUT entry, the adder/subtractor 306 subtracts the third bit-shifted value from the current value in the accumulation register 308 and stores the result in the accumulation register 308. At that point, the process is complete, and the value stored in the accumulation register 308 is output as an output sample.

Note that the while FIG. 3 illustrates a serial implementation of the shifting operations, the approximate multiplication function 206 may alternatively use multiple shifters 304 in parallel to perform the bit-shifting operations in parallel.

In order to perform the approximate multiplication, the approximation function 214 needs to compute the first set of values $\{p_1, p_2, \ldots, p_k\}$ (i.e., the power values) and the second set of values $\{s_1, s_2, \ldots, s_k\}$ (i.e., the sign values) for each LUT entry by approximating the corresponding initial LUT value as:

$$LUT_{INT} \approx s_1 \cdot 2^{P_1} + s_2 \cdot 2^{P_2} + \ldots + s_k \cdot 2^{P_k},$$

as discussed above. One process for performing this approximation is outlined in by the pseudo-code below. This process transforms the initial LUT values output by the LUT conversion function 212 to a power of two representation. To understand how this process works, consider for example an initial LUT value of 45. The process will approximate the value of 45 as $2^5+2^4-2^1=46$. The new LUT entry stored in the LUT 204 will store information that represents the powers (i.e., 5, 4, and 1) and signs (i.e., 1, 1, and −1). As an example, four bits may be used to store each power and one bit may be used to store its sign. Therefore, for, e.g., three variables, only 15 bits are needed. As discussed below, in one embodiment, the number of variables is three because experiments (explained later) reveal that three variables are sufficient to achieve the ACLR levels needed for NR 3GPP specification.

```
variables=3;%number of variables that represent a number
powers_matrix=zeros(1,variables,numel(LUT)); %p1,p2,...,pk for each LUT index
signs_matrix=ones(1,variables, numel(LUT)); %s1,s2,...,sk for each LUT index
for input_iter=1:numel(LUT) %this loop runs iterates through entire LUT
    input=LUT(input_iter);%get each lut element 1 by 1
    for iter=1:variables %loop to compute p1,p2,...,pk and s1,s2,...,sk for current LUT entry
        n=0;
        target=0; %target value for 2^powers_matrix(1,iter,input_iter)
        sum=0;
        if (iter==1) %for p1 the target is always the input value
            target=input;
        else %e.g,. for p2, the target is abs(input-2^p1)
            for j=1:(iter-1) %det sum of product of 2's based on current powers and signs
                if (signs_matrix(1,j,input_iter)==1)
                    sum=sum + 2^powers_matrix(1,j,input_iter);
                else
                    sum=sum-2^powers_matrix(1,j,input_iter);
                end
            end
            target=abs(input-sum);
        end
        if (target == 0) %need this or else can get negative value of n-1 if target == 0
            n=1;
        power_after=n;
```

```
        else
            while ((2^n)<=target) %find 2^n representation>target
                n=n+1;
                power_after=n; %this is the next power of 2>target
            end
        end
        power_before=(n-1);%this is the power of 2 <target
        if(abs((2^power_after)-target)<abs((2^power_before)-target)) %Find
closeset number
            chosen_power=power_after;
        else
            chosen_power=power_before;
        end
        powers_matrix(1,iter,input_iter)=chosen_power; %element inside powers
matrix
        new_sum=0;
        for j=1:iter %determine new sum of product of 2's after adding new value
            if (signs_matrix(1,j,input_iter)==1)
                new_sum=new_sum + 2^powers_matrix(1,j,input_iter);
            else
                new_sum=new_sum-2^powers_matrix(1,j,input_iter);
            end
        end
        if (new_sum>input) %choose the correct sign for next variable
            if ((iter+1)<=variables)
                signs_matrix(1,iter+1,input_iter)= -1;
            end
        else
            if ((iter+1)<=variables)
                signs_matrix(1,iter+1,input_iter)=1;
            end
        end
    end
end
```

Figure 4:
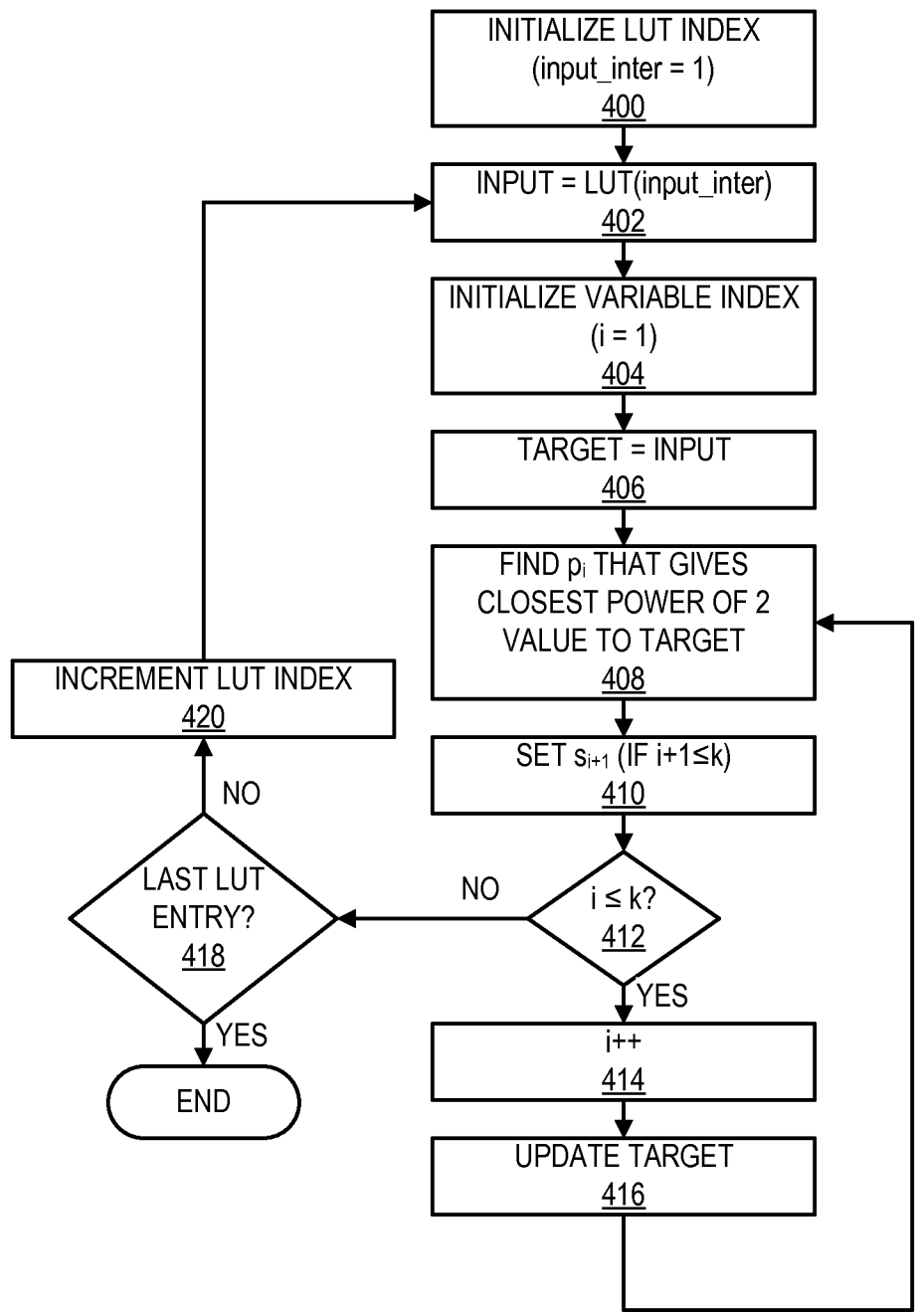
FIG. 4 is a flow chart that illustrates a process for computing Look-Up Table (LUT) entry values where each LUT entry value represents an approximation of a respective desired DPD value as a combination of power of 2 values in accordance with embodiments of the present disclosure.

The process above is outlined by the flowchart of FIG. 4. As illustrated in FIG. 4, the approximation function 214 initializes a LUT index to 1 (step 400). In the pseudocode above, the LUT index is referred to as "input_inter." The approximation function 214 sets an input parameter equal to the initial LUT value corresponding to the LUT index, which is denoted here as LUT(input_inter), (step 402). The approximation function 214 also initializes a variable index i to 1 (step 404). In the pseudocode above, the variable index is referred to as "inter."

The approximation function 214 sets a target parameter equal to the input, where the input is LUT(input_inter) (step 406) and finds a value of $p_i$ that gives a power of 2 (i.e., $2^{p_i}$) that is closest to the target (step 408). Based on the chosen value of $p_i$ and LUT(input_inter), the approximation function 214 determines the sign value $s_{i+1}$ for the next iteration (step 410). Specifically, if $\Sigma_{j=1}^{i} s_j 2^{p_j}$ is less than the input, then the sign value $s_{i+1}$ is set to +1; otherwise, the sign value $s_{i+1}$ is set to −1. Note that step 410 does not need to be performed for the last iteration (i.e., where i=k where k is the number of variables as described above). The approximation function 214 determines whether i<k (step 412). If so, the variable index i is incremented (step 414), and the approximation function 214 updates the target (step 416). Specifically, the updated target is computed as:

$$\text{target} = \text{abs}\left(\text{input} - \sum_{j=1}^{i-1} s_j 2^{p_j}\right).$$

The process returns to step 408 and is repeated for the next power of 2. Once i=k, all of the set of power of 2 values $\{p_1, p_2, \ldots, p_k\}$ and the second set of sign values $\{s_1, s_2, \ldots, s_k\}$ that define the combination of k power of 2 values that approximate the initial LUT value for the current LUT index have been computed and can be stored in the LUT 204.

The approximation function 214 determines whether the initial LUT value for the last LUT index has been approximated (step 418). If not, the LUT index is incremented (step 420) and the process returns to step 402 and is repeated for the next LUT value. Once all of the LUT table values have been approximated, the process ends.

The following example illustrates the process of FIG. 4 (and also the process outlined in the pseudocode above).

Assume an initial LUT value of 91 and k=3.

The input value is set to 91.

The target is initially set to the input value (i.e., target=91).

For the first iteration where i=1
  $p_1$ is computed as the value that gives a value of $2^{p_1}$ that is closest to the target (i.e., the closest to 91). Thus, $p_i$=6.
  $s_1$ is always +1
  The value of $s_2$ is set to +1. In particular, since $2^6$ is less than the input value of 91, $s_2$ is set to +1. Note that if $2^{p_1}$ had been greater than the input value, then $s_2$ is would have then been set to −1.

For the second iteration where i=2
  The target is updated as:

$$\text{target} = \text{abs}\left(\text{input} - \sum_{j=1}^{i-1} s_j 2^{p_j}\right)$$

Thus, for this second iteration the target is set to abs(91−$2^6$)=27.

$p_2$ is computed as the value that gives a value of $2^{p_2}$ that is closest to the new target (i.e., the closest to 27). Thus, $p_2=5$.

The value of $s_3$ is set to −1. In particular, since $2^6+2^5=96$ is greater than the input value of 91, $s_3$ is set to −1.

For the third iteration where i=3
The target is updated as:

$$\text{target} = \text{abs}\left(\text{input} - \sum_{j=1}^{i-1} s_j 2^{p_j}\right)$$

Thus, for this second iteration the target is set to $\text{abs}(91-2^6-2^5)=5$.

$p_3$ is computed as the value that gives a value of $2^{p_3}$ that is closest to the new target (i.e., the closest to 5). Thus, $p_3=2$.

As a result, the initial LUT value of 91 is approximated as $2^6+2^5-2^2=92$, where the set of power of 2 values {6,5,2} and the second set of sign values {1,1,−1}. Information that represents the set of power of 2 values {6,5,2} and the second set of sign values {1,1,−1} is stored in the corresponding entry in the LUT 204 and is used by the approximate multiplication function 206 to perform multiplication using, in this example, three bit shift operations and combining the results in accordance with the sign values {1,1,−1}.

Simulations were run using a PA model. The signal used was a 400 megahertz (MHz) wide LTE signal with sampling rate fs=2.212 gigahertz (GHz). The simulations used an implementation of the DPD system 200 based on a memory polynomial model with nonlinear order of 5 and memory length of 3, which results in three LUTs per DPD actuator. Simulations were run using three different coefficients per LUT: 64, 32, and 16.

The performance is measured in terms of time-domain Error Vector Magnitude (EVM) and ACLR. Based on the 3GPP specification for NR, the ACLR requirements per transmit (TX) branch is <−28 dBc. Usually telecom vendors have internal requirements of higher ACLR to ensure that the noise margins also meet operator/region requirements. Therefore, a conservative adjusted ACLR of −35 dBc is used.

Figure 5:
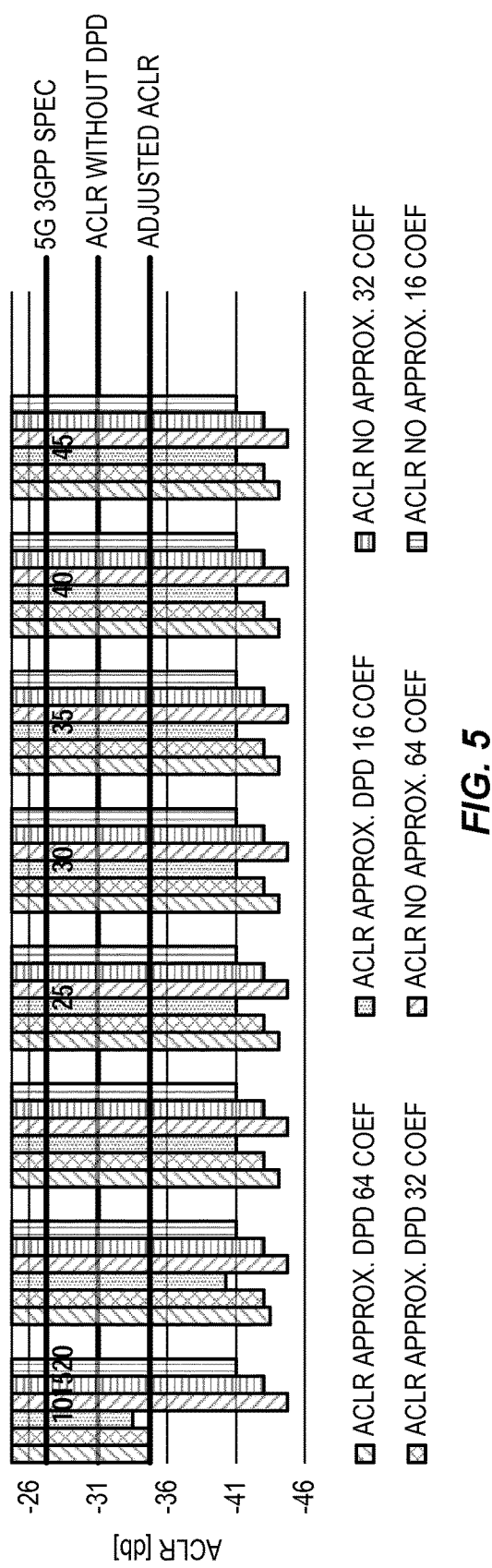
FIG. 5 shows simulated Adjacent Channel Leakage Ratio (ACLR) values obtained using the proposed multiplier.

FIG. 5 shows the ACLR results obtained using three implementations of the proposed DPD system using 64, 32, and 16 coefficients per LUT. For comparison purposes, the ACLR results obtained using a conventional DPD system, i.e., one that does not use approximate multiplications, are also included. It can be seen that for all the proposed actuators, only three variables (i.e., 15 bits) were necessary to achieve the required ACLR level. Compared to a conventional DPD actuator, the proposed actuators obtain slightly higher ACLR values, which was caused by the use of approximate multiplications. It is important to highlight that despite that, the results are still within the ACLR budget for NR.

Figure 6:
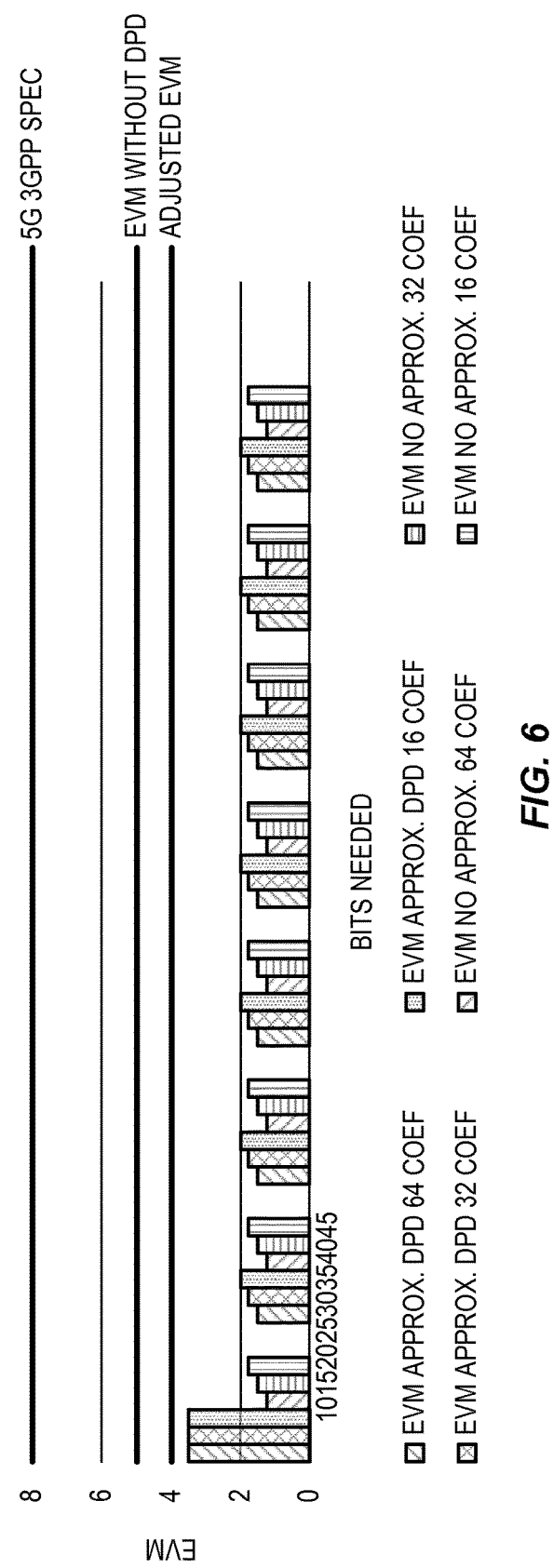
FIG. 6 shows that three variables are sufficient to reach required Error Vector Magnitude (EVM) levels for Fifth Generation (5G) New Radio (NR)

Similarly, FIG. 6 shows that three variables are sufficient to reach required EVM levels. The EVM requirement specified by 3GPP NR is 8%. However, we have adjusted it conservatively to 4% since crest factor reduction induces a loss in EVM.

Finally, the energy and area saving potential of the proposed DPD system 200 will be discussed. Intuitively, a 16-bit multiplier requires 16 half adders and 240 full adders. To meet the high clock speeds, the multiplier is commonly pipelined in 2-3 stages. The proposed architecture of the DPD system 200 of FIG. 3 requires only 2 additions (using 30 full adders and 2 half adders) for accumulation. It requires two additional full adders for the mod3 counter 310. The shifter overhead is negligible. Therefore, in terms of area, the proposed architecture requires 34 adders compared to 256 needed for a conventional DPD actuator. In terms of energy, the proposed architecture requires only 70 additions compared to 256 needed for the conventional multiplier. Hence the proposed architecture saves 86% area and 72% power.

As described herein, a DPD system is disclosed that exploits the lower ACLR requirements specified by 3GPP specifications. The embodiments described herein promise massive reduction in energy and area compared to conventional DPD systems by transforming all the multiplications to shift accumulate operations. As described herein, the DPD system operates as follows. During the adaptation phase of DPD, the LUT values are represented as combinations of k powers of 2. Experiments revealed that the required ACLR can be achieved using only three variables. For each LUT entry, the desired LUT value is approximated as the combination of k powers of 2 that is closest to the desired LUT entry. This step has low overall cost since table conversion occurs infrequently. Once the LUT entries are stored as power of 2 representations, the DPD actuator uses the LUT to perform shift and combine operations to approximate multiplication of input samples and the appropriate values to provide a predistorted output signal.

Figure 7:
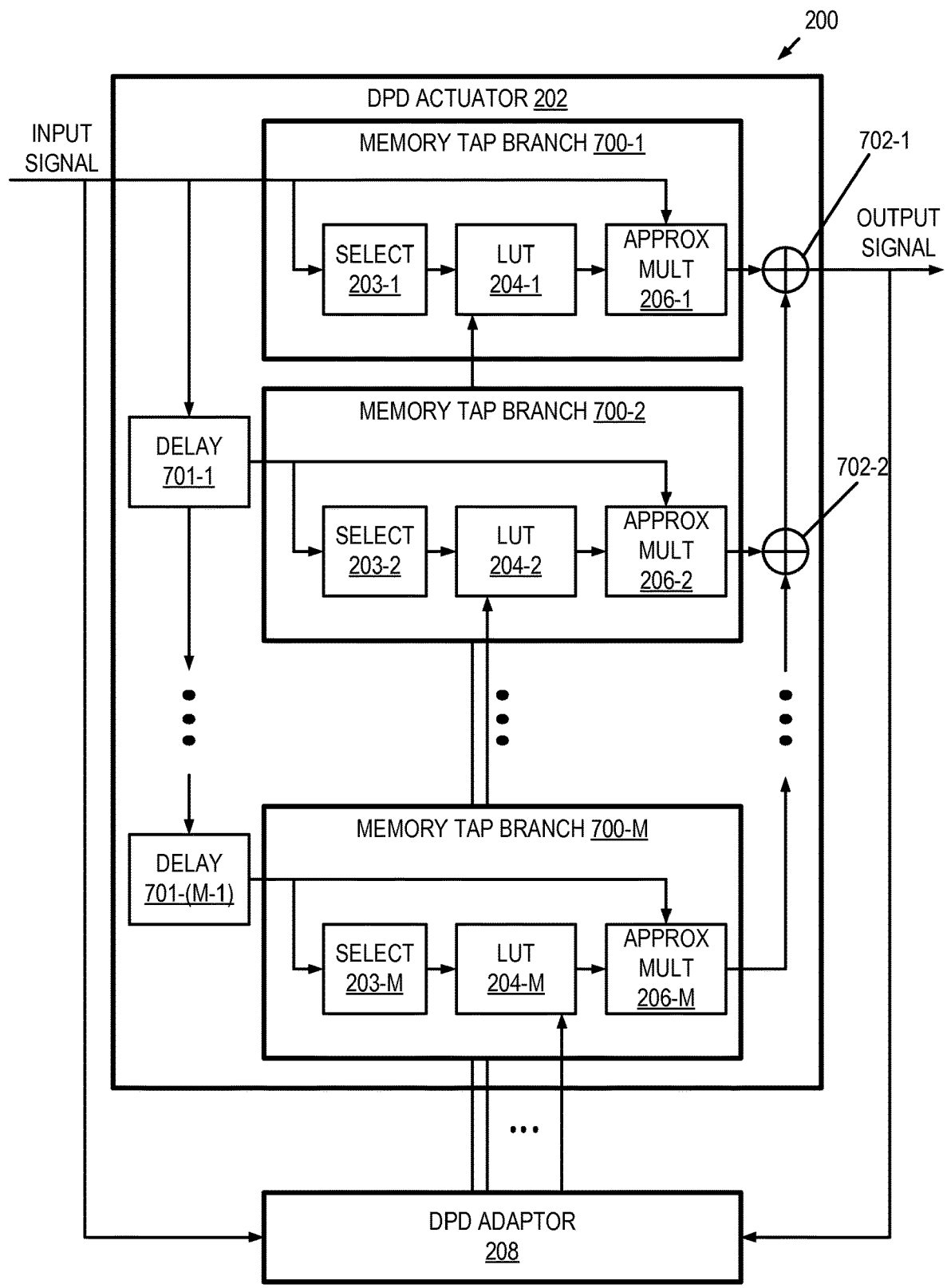
FIG. 7 illustrates the DPD system of FIG. 2 in which the DPD system has been expanded to include multiple memory taps to compensate for memory effects in accordance with some embodiments of the present disclosure.

As discussed above, the DPD system 200 is illustrated in FIG. 2 and described above as a single tap system. However, in many implementations, a multi-tap DPD system is needed to compensate for memory effects. In this regard, FIG. 7 illustrates another example of the DPD system 200 in which the DPD actuator 202 includes M memory taps, each having its own 2 selection function 203, LUT 204, and approximate multiplication function 206, which are denoted in FIG. 7 as memory tap branches 2700-1 through 2700-M. The DPD actuator 2202 of FIG. 7 also includes a number of delays 7701-1 through 7701-(M−1) and a number of adders 702-1 through 702-(M−1). As illustrated, the memory tap branch 2700-1 digitally predistorts the input signal to provide a first output signal as described above. In a similar manner, the memory tap branch 2700-2 digitally predistorts a first delayed version of the input signal output by the delay 7701-1 to provide a second output signal. Likewise, the memory tap branch 2701-M digitally predistorts a (M−1)-th delayed version of the input signal output by the delay 7701-(M−1) to provide a Mth output signal. The M output signals of the M memory tap branches 2700-1 through 2700-M are added by the adders 702-1 through 702-(M−1) to provide the output signal of the DPD actuator 2202.

Notably, each memory tap branch 2700-m (for m=1, 2, . . . , M) has its own LUT 204-m. The DPD adaptor 208 generates and updates the LUT entries of the LUTs 204-1 through 204-M in the manner described above. However, as will be appreciated by one of ordinary skill in the art upon reading this disclosure, the DPD adaptor 208 generates the initial LUT values for the LUTs 204-1 through 204-M using an appropriate adaptation scheme that takes memory effects into account. Then, as described above, for each LUT entry in each LUT 204-m, the DPD adaptor 208 approximates the initial LUT value for that LUT entry of that LUT 204-m as a combination of k powers of 2, as described above, and stores the respective set of power values $\{p_1, p_2, \ldots, p_k\}$ and the respective set of sign values $\{s_1, s_2, \ldots, s_k\}$ in the LUT entry.

Figure 8:
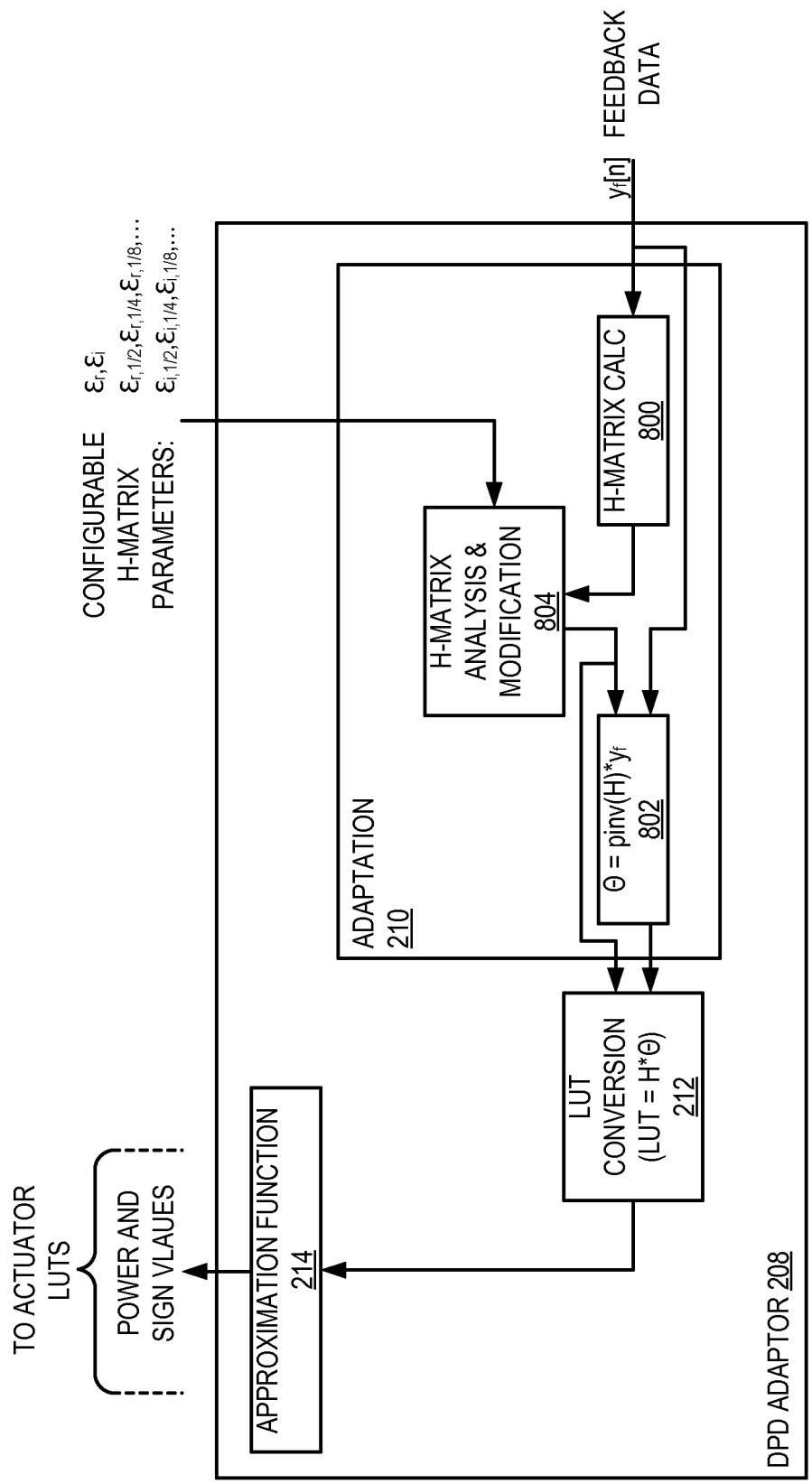
FIG. 8 illustrates one example of a DPD adaptor in accordance with some embodiments of the present disclosure.

FIG. 8 illustrates one example of the DPD adaptor 208 in accordance with some embodiments of the present disclosure. As illustrated, the DPD adaptor 208 includes the adaptation function 210, the LUT conversion function 212, and the approximation function 214, as described above. The adaptation function 210 and the LUT conversion function 212 operate to generate the desired DPD values for the LUTs 204 based on some optimization algorithm, as will be understood by those of skill in the art of LUT-based DPD systems. In this example, the adaptation function 210 includes an H-matrix calculation function 800 and a θ calculation function 802. In addition, the adaptation function 210 includes an optional H-matrix analysis and modification function 804. The H-matrix calculation function 800 calculates an H-matrix based on a feedback signal (e.g., from the output of the PA). Optionally, for each complex value in the H-matrix, the H-matrix analysis and modification function 804 determines whether the real and imaginary components of the complex value can be approximated as a power of 2 value, within some predefined or preconfigured degree of accuracy (e.g., as configured by configurable H-matrix parameters). Real and imaginary component values in the H-matrix that can be approximated as power of 2 values within the predefined or preconfigured degree of accuracy are replaced with corresponding power of 2 values. The modified H-matrix is provided to the θ calculation function 802 and used, together with the feedback signal, to compute θ. The LUT conversion function 212 then computes desired (complex) DPD values based on the (modified) H-matrix and θ.

Figure 9:
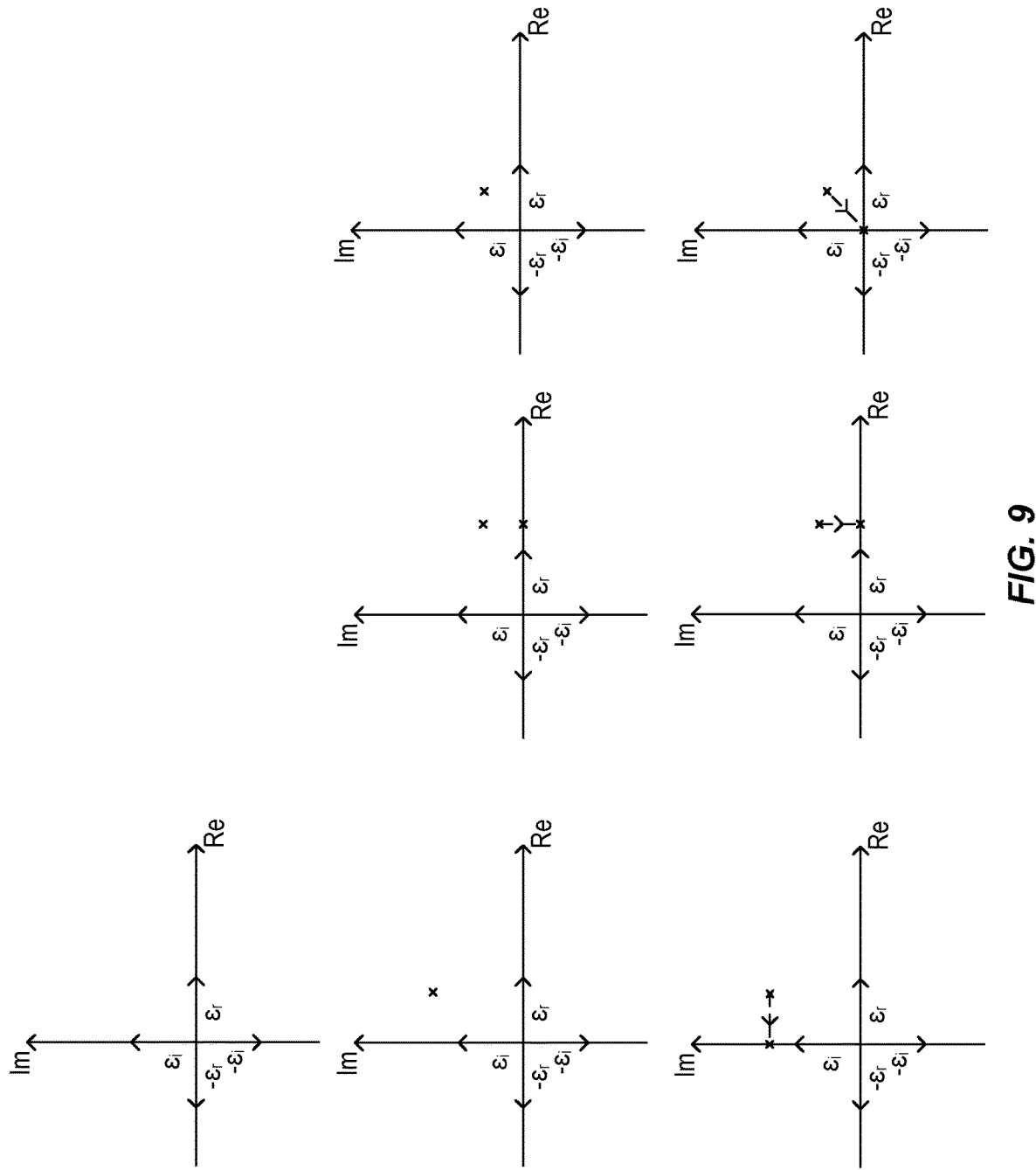
FIG. 9 illustrates several examples of the approximation of the real and/or imaginary components of a complex value as 0 based on $\varepsilon_r$ and $\varepsilon_i$.
Figure 10:
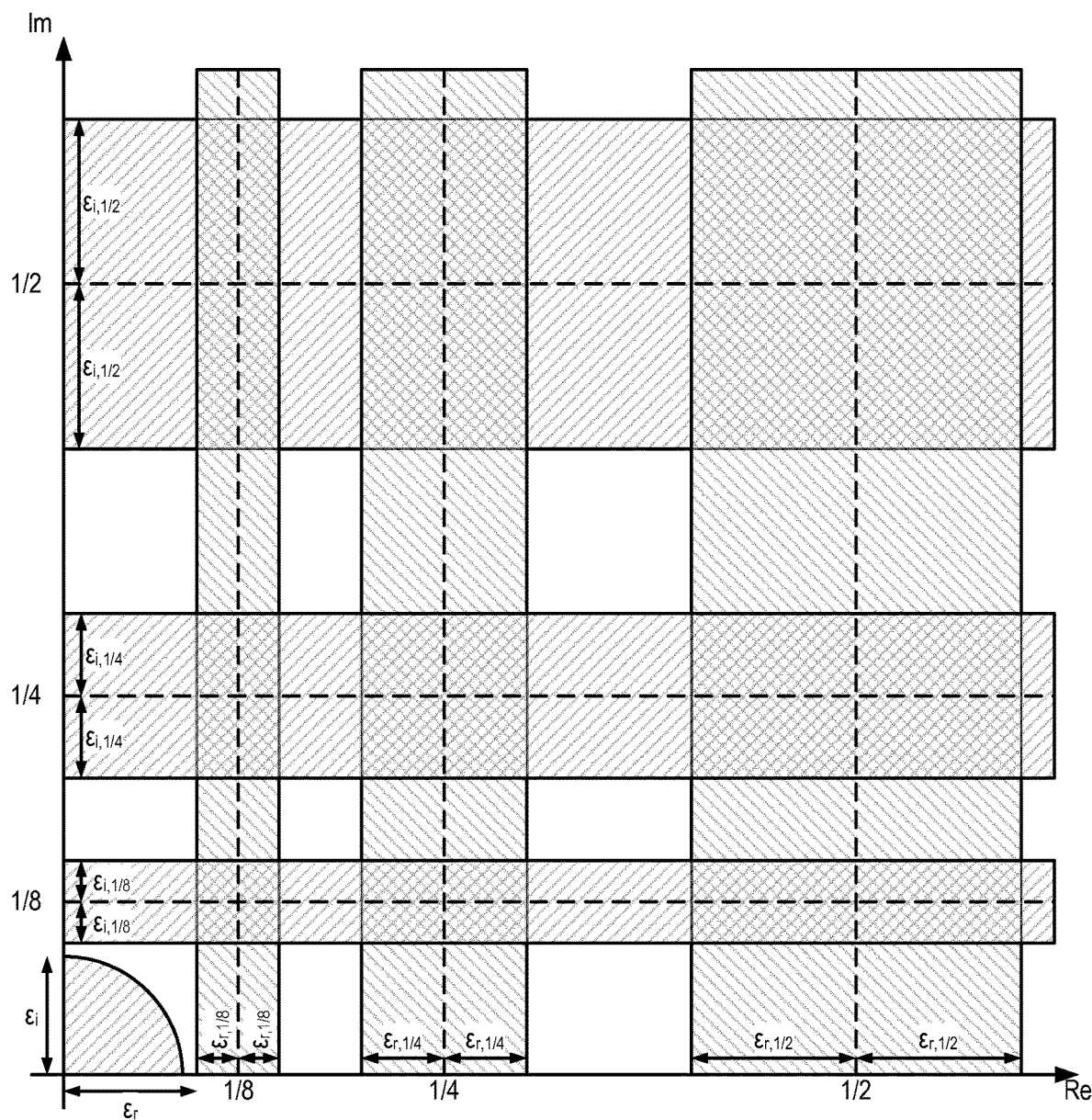
FIG. 10 is a visual representation of the value ranges defined by the parameters of FIGS. 8 and 9 within which the real and/or imaginary components of a complex value can be approximated as a power of 2 value.

Note that the predefined or preconfigured degree of accuracy is, in this example, defined by a number of configurable parameters. Specifically, these parameters include: $\varepsilon_r$ which defines a range of real values centered at a value of 0 within which a real value can be approximated as 0, $\varepsilon_i$ which defines a range of imaginary values centered at a value of 0 within which an imaginary value can be approximated as 0, $\varepsilon_{r,1/2}$ which defines a range of real values centered at a value of ½ within which a real value can be approximated as ½ (i.e., $2^{-1}$), $\varepsilon_{i,1/2}$ which defines a range of imaginary values centered at a value of ½ within which an imaginary value can be approximated as ½ (i.e., $2^{-1}$), $\varepsilon_{r,1/4}$ which defines a range of real values centered at a value of ¼ within which a real value can be approximated as ¼ (i.e., $2^{-2}$), $\varepsilon_{i,1/4}$ which defines a range of imaginary values centered at a value of ¼ within which an imaginary value can be approximated as ¼ (i.e., $2^{-2}$), $\varepsilon_{r,1/8}$ which defines a range of real values centered at a value of ⅛ within which a real value can be approximated as ⅛ (i.e., $2^{-8}$), $\varepsilon_{i,1/8}$ which defines a range of imaginary values centered at a value of ⅛ within which an imaginary value can be approximated as ⅛ (i.e., $2^{-8}$), etc. In this regard, FIG. 9 illustrates several examples of the approximation of the real and/or imaginary components of a complex value as 0 based on $\varepsilon_r$ and $\varepsilon_i$. FIG. 10 is a visual representation of the value ranges defined by the aforementioned parameters within which the real and/or imaginary components of a complex value can be approximated as a power of 2 value. Note that parameters discussed above assume approximation of the real and imaginary components of the complex DPD values as a single power of 2 value. However, in some other embodiments, approximation of the real and imaginary components of the complex DPD values as a combination of two or more power of 2 values, in which case the parameters would include some parameter(s) that defines an acceptable range of values around a particular value represented as a combination of two or more power of 2 values in which a real/imaginary component of a DPD value can be approximated as the combination of two or more power of 2 values.

Also note that, in the case of complex DPD values and a complex input signal, each LUT entry preferably includes separate information for I and Q, as discussed above. In other words, in order to approximate a multiplication of two complex values (i.e., a complex value sample of the input signal and a complex value of the desired predistortion), each LUT entry in the LUT 204 may include: (a) first information that defines the bit-shifting operations and combinations of the resulting bit-shifted values needed to approximate a multiplication of either the real component or the imaginary component of the sample of the input signal and the real component of the desired predistortion and (b) second information that defines the bit-shifting operations and combinations of the resulting bit-shifted values needed to approximate a multiplication of either the real component or the imaginary component of the sample of the input signal and the imaginary component of the desired predistortion. In other words, the multiplication of a complex input sample $(I_{in}, Q_{in})$ and a respective complex DPD value $(I_{DPD}, Q_{DPD})$ can be expressed as:

$$(I_{in}+iQ_{in})\cdot(I_{DPD}+iQ_{DPD})=I_{in}I_{DPD}-Q_{in}Q_{DPD}+ iI_{in}Q_{DPD}+iI_{DPD}Q_{in}.$$

Thus, in some embodiments, to approximate complex multiplication, each DPD actuator 202 includes four approximate multiplication functions 206 to generate the terms $I_{in}I_{DPD}$, $Q_{in}Q_{DPD}$, $I_{in}Q_{DPD}$, and $I_{DPD}Q_{in}$ using respective combinations of bit shifting operations in accordance with respective information stored in applicable LUT entry (i.e., a first set of power values and sign values for $I_{DPD}$ and a second set of power values and sign values for $Q_{DPD}$ in a manner similar to that described herein). For a particular complex input sample, the outputs of the four approximate multiplication functions 206 are combined in accordance with the equation above to provide the real and imaginary components of the output sample.

Thus, returning to FIG. 8, for each complex desired DPD value, the approximation function 214 approximates each of the real and imaginary components of the desired complex DPD value as a combination of k power of 2 values, as described above, and provides the resulting sets of power and sign values to the LUT 204 for storage in the appropriate LUT entry.

Note that the H-matrix calculation function 800 and the θ calculation function 802 of FIG. 8 are only examples. The main aspect to be illustrated by the adaptation function 210 of FIG. 8 is that there may be an approximation within the adaptation function 210 before the generation of the desired DPD values. Such an approximation can be used for any LUT creation based adaptation algorithm and for any data input to the LUT conversion function 212. Such approximations may simplify the LUT value generation algorithm calculations and may, therefore, lower overall total power consumption.

Figure 11:
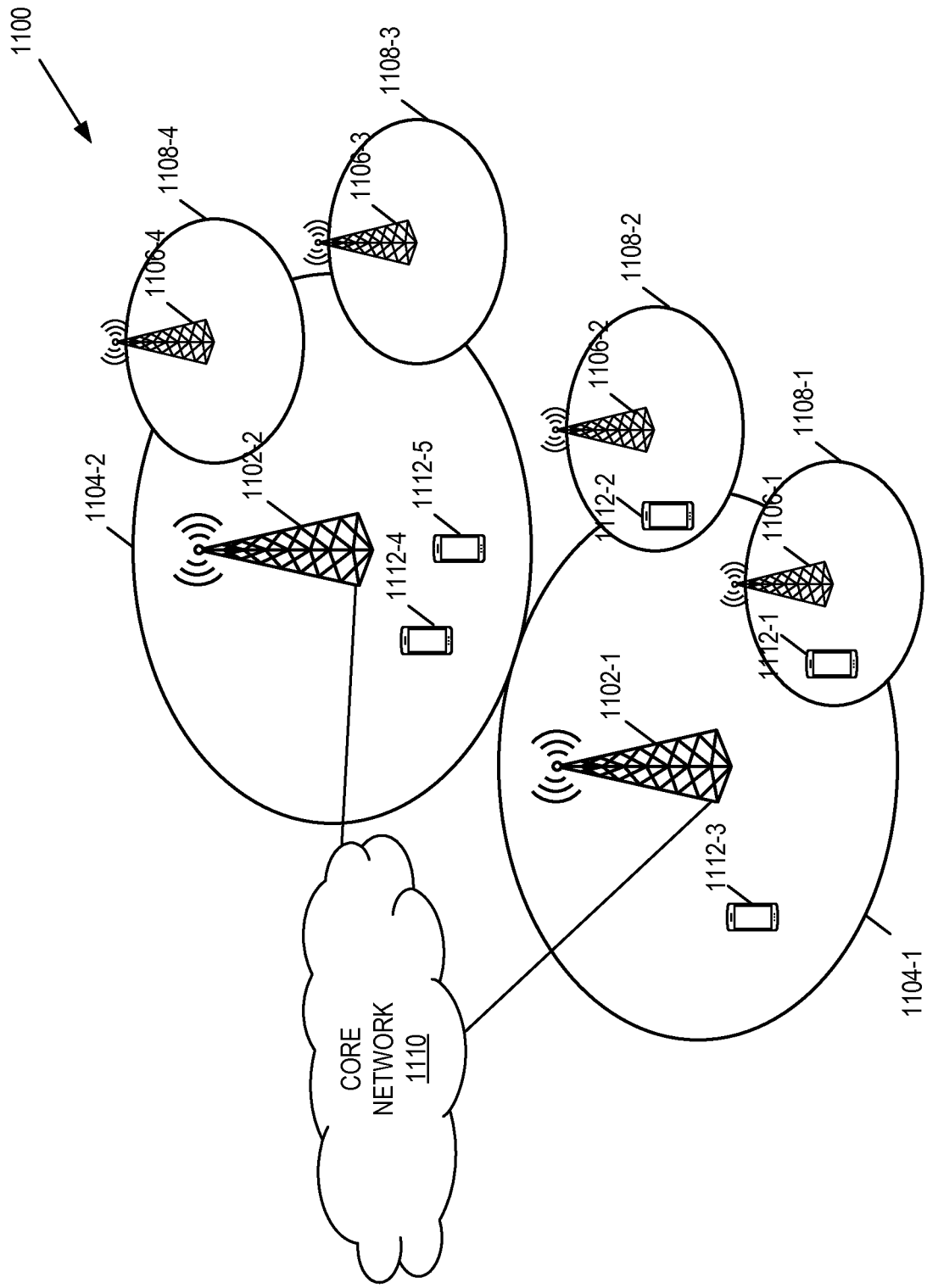
FIG. 11 illustrates one example of a cellular communications network according to some embodiments of the present disclosure.

While the disclosed DPD system 200 can be used in any type of wireless transmitter, in some embodiments the DPD system 200 is implemented in a radio node (e.g., a base station or wireless device (e.g., a UE)) in a cellular communications network. In this regard, FIG. 11 illustrates one example of a cellular communications network 1100 in which one or more radio nodes include the DPD system 200 according to some embodiments of the present disclosure. In the embodiments described herein, the cellular communications network 1100 is a 3GPP 5G NR network. In this example, the cellular communications network 1100 includes base stations 1102-1 and 1102-2, which in 5G NR are referred to as gNBs, controlling corresponding macro cells 1104-1 and 1104-2. The base stations 1102-1 and 1102-2 are generally referred to herein collectively as base stations 1102 and individually as base station 1102. Likewise, the macro cells 1104-1 and 1104-2 are generally referred to herein collectively as macro cells 1104 and individually as macro cell 1104. The cellular communications network 1100 may also include a number of low power nodes 1106-1 through 1106-4 controlling corresponding small cells 1108-1 through 1108-4. The low power nodes 1106-1 through 1106-4 can be small base stations (such as pico or femto base stations) or Remote Radio Heads (RRHs), or the like. Notably, while not illustrated, one or more of the small cells 1108-1 through 1108-4 may alternatively be provided by the base stations 1102. The low power nodes 1106-1 through 1106-4 are generally referred to herein collectively as low power nodes 1106 and individually as low power node 1106. Likewise, the small cells 1108-1 through 1108-4 are generally referred to herein collectively as small cells 1108 and individually as small cell 1108. The base stations 1102 (and optionally the low power nodes 1106) are connected to a core network 1110.

The base stations 1102 and the low power nodes 1106 provide service to wireless devices 1112-1 through 1112-5 in the corresponding cells 1104 and 1108. The wireless devices 1112-1 through 1112-5 are generally referred to herein collectively as wireless devices 1112 and individually as wireless device 1112. The wireless devices 1112 are also sometimes referred to herein as UEs.

Figure 12:
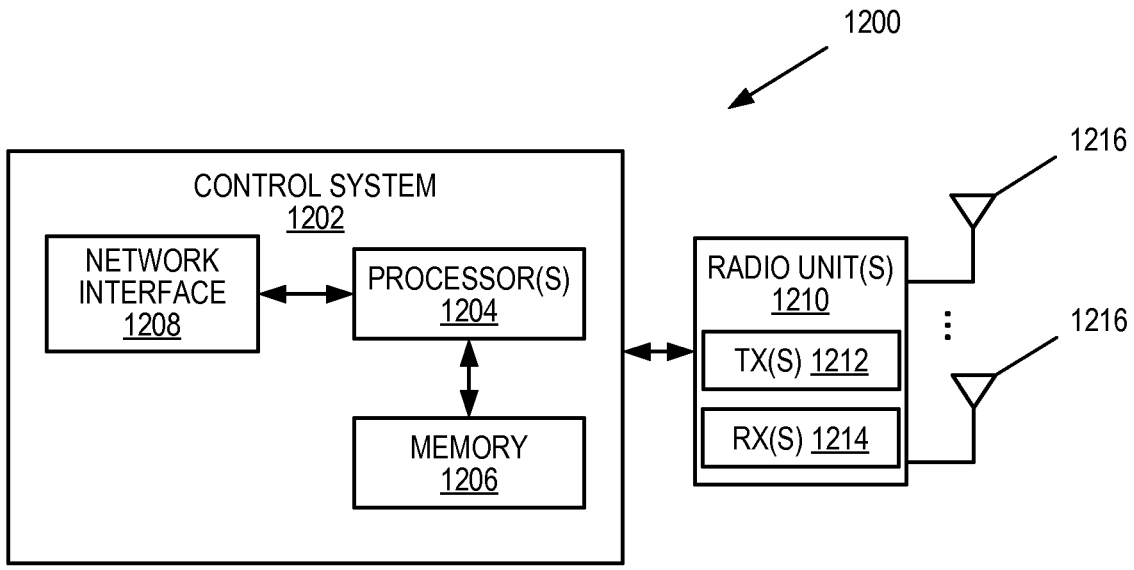
FIG. 12 is a schematic block diagram of a radio access node according to some embodiments of the present disclosure.

FIG. 12 is a schematic block diagram of a radio access node 1200 according to some embodiments of the present disclosure. The radio access node 1200 may be, for example, a base station 1102 or 1106. As illustrated, the radio access node 1200 includes a control system 1202 that includes one or more processors 1204 (e.g., Central Processing Units (CPUs), Application Specific Integrated Circuits (ASICs), Field Programmable Gate Arrays (FPGAs), and/or the like), memory 1206, and a network interface 1208. The one or more processors 1204 are also referred to herein as processing circuitry. In addition, the radio access node 1200 includes one or more radio units 1210 that each includes one or more transmitters 1212 and one or more receivers 1214 coupled to one or more antennas 1216. The radio units 1210 may be referred to or be part of radio interface circuitry. In some embodiments, the radio unit(s) 1210 is external to the control system 1202 and connected to the control system 1202 via, e.g., a wired connection (e.g., an optical cable). However, in some other embodiments, the radio unit(s) 1210 and potentially the antenna(s) 1216 are integrated together with the control system 1202. In some embodiments, the DPD system 200 is implemented in the transmitter(s) 1212.

Figure 13:
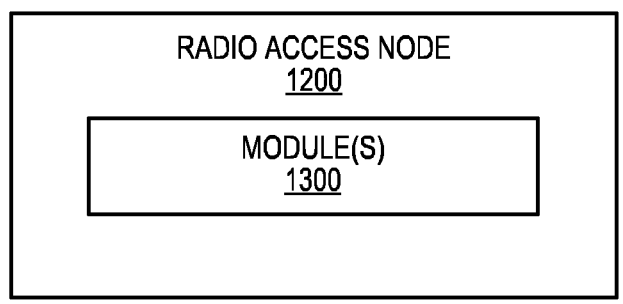
FIG. 13 is a schematic block diagram of the radio access node of FIG. 12 according to some other embodiments of the present disclosure.

FIG. 13 is a schematic block diagram of the radio access node 1200 according to some other embodiments of the present disclosure. The radio access node 1200 includes one or more modules 1300, each of which is implemented in software. The module(s) 1300 provide the functionality of the radio access node 1200 described herein. For example, at least some of the functionality of the DPD system 200 may be implemented by the module(s) 1300.

Figure 14:
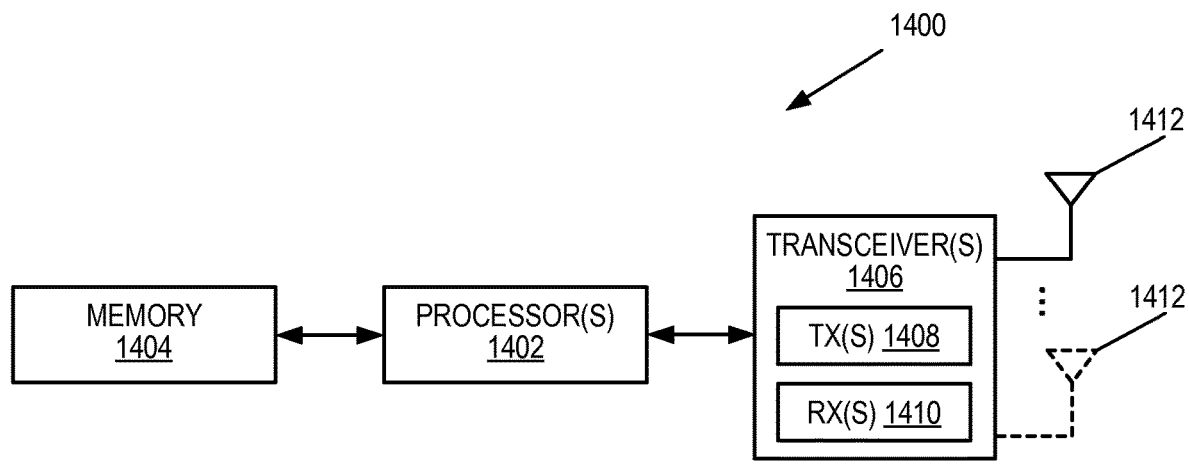
FIG. 14 is a schematic block diagram of a User Equipment device (UE) according to some embodiments of the present disclosure.

FIG. 14 is a schematic block diagram of a UE 1400 according to some embodiments of the present disclosure. As illustrated, the UE 1400 includes one or more processors 1402 (e.g., CPUs, ASICs, FPGAs, and/or the like), memory 1404, and one or more transceivers 1406 each including one or more transmitters 1408 and one or more receivers 1410 coupled to one or more antennas 1412. The processors 1402 are also referred to herein as processing circuitry. The transceivers 1406 are also referred to herein as radio circuitry. In some embodiments, the DPD system 200 is implemented in the transmitter(s) 1408. Note that the UE 1400 may include additional components not illustrated in FIG. 14 such as, e.g., one or more user interface components (e.g., a display, buttons, a touch screen, a microphone, a speaker(s), and/or the like), a power supply (e.g., a battery and associated power circuitry), etc.

In some embodiments, a computer program including instructions which, when executed by at least one processor, causes the at least one processor to carry out the functionality of the UE 1400 according to any of the embodiments described herein is provided. In some embodiments, a carrier comprising the aforementioned computer program product is provided. The carrier is one of an electronic signal, an optical signal, a radio signal, or a computer readable storage medium (e.g., a non-transitory computer readable medium such as memory).

Figure 15:
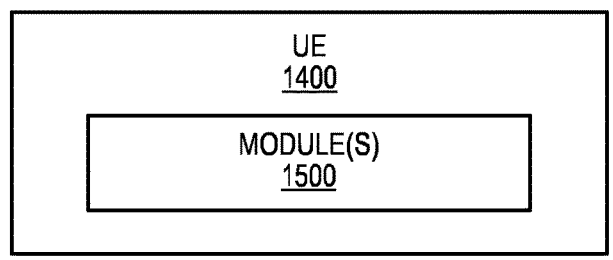
FIG. 15 is a schematic block diagram of the UE of FIG. 14 according to some other embodiments of the present disclosure.

FIG. 15 is a schematic block diagram of the UE 1400 according to some other embodiments of the present disclosure. The UE 1400 includes one or more modules 1500, each of which is implemented in software. The module(s) 1500 provide the functionality of the UE 1400 described herein. For example, at least some of the functionality of the DPD system 200 may be implemented by the module(s) 1500.

Any appropriate steps, methods, features, functions, or benefits disclosed herein may be performed through one or more functional units or modules of one or more virtual apparatuses. Each virtual apparatus may comprise a number of these functional units. These functional units may be implemented via processing circuitry, which may include one or more microprocessor or microcontrollers, as well as other digital hardware, which may include Digital Signal Processors (DSPs), special-purpose digital logic, and the like. The processing circuitry may be configured to execute program code stored in memory, which may include one or several types of memory such as Read Only Memory (ROM), Random Access Memory (RAM), cache memory, flash memory devices, optical storage devices, etc. Program code stored in memory includes program instructions for executing one or more telecommunications and/or data communications protocols as well as instructions for carrying out one or more of the techniques described herein. In some implementations, the processing circuitry may be used to cause the respective functional unit to perform corresponding functions according one or more embodiments of the present disclosure.

While processes in the figures may show a particular order of operations performed by certain embodiments of the present disclosure, it should be understood that such order is exemplary (e.g., alternative embodiments may perform the operations in a different order, combine certain operations, overlap certain operations, etc.).

At least some of the following abbreviations may be used in this disclosure. If there is an inconsistency between abbreviations, preference should be given to how it is used above. If listed multiple times below, the first listing should be preferred over any subsequent listing(s).

3GPP Third Generation Partnership Project
5G Fifth Generation
ACLR Adjacent Channel Leakage Ratio
ASIC Application Specific Integrated Circuit
CPU Central Processing Unit dBc Decibels Relative to the Carrier
DPD Digital Predistortion
DSP Digital Signal Processor
eNB Enhanced or Evolved Node B
EVM Error Vector Magnitude
FPGA Field Programmable Gate Array
GHz Gigahertz
gNB New Radio Base Station
LTE Long Term Evolution
LUT Look-Up Table
MHz Megahertz
MME Mobility Management Entity
MTC Machine Type Communication
NR New Radio
PA Power Amplifier
P-GW Packet Data Network Gateway
RAM Random Access Memory
ROM Read Only Memory
RRH Remote Radio Head
SCEF Service Capability Exposure Function
TX Transmit
UE User Equipment Those skilled in the art will recognize improvements and modifications to the embodiments of the present disclosure. All such improvements and modifications are considered within the scope of the concepts disclosed herein.

What is claimed is:

1. A system comprising:
a Digital Predistortion, DPD, system for digitally predistorting an input signal to provide a predistorted output signal, the DPD system comprising:
a DPD actuator comprising:
a Look-Up Table, LUT, comprising a plurality of LUT entries, wherein each LUT entry comprises information that represents a first set of values $\{p_1, p_2, \ldots, p_k\}$ and a second set of values $\{s_1, s_2, \ldots, s_k\}$ that together represent a LUT value of $s_1 \cdot 2^{P_1} + s_2 \cdot 2^{P_2} + \ldots + s_k \cdot 2^{P_k}$ where each value $s_i \in \{+1, -1\}$ for all $i=1, 2, \ldots, k$ and $k \geq 2$;
select circuitry operable to, for each input sample of a plurality of input samples of the input signal, select a LUT entry from among the plurality of LUT entries comprised in the LUT based on a value derived from the input sample that is indicative of a power of the input signal; and
an approximate multiplication function comprising shifting and combining circuitry that operates to, for each input sample of the plurality of input samples of the input signal:
for each value $p_i$ in the first set of values $\{p_1, p_2, \ldots, p_k\}$ for the selected LUT entry, shift a plurality of bits that form a binary representation of the input sample by $p_i$ bit positions to provide a respective shifted value; and
combine the shifted values using additions and subtractions in accordance with signs defined by the second set of values $\{s_1, s_2, \ldots, s_k\}$ to thereby provide a binary representation of an output sample.

2. The system of claim 1 wherein the DPD system further comprises an adaptor that operates to update the plurality of LUT entries in the LUT.

3. The system of claim 2 wherein the adaptor comprises a modification function and a LUT conversion function operable to generate a plurality of initial LUT values to be approximated by the information stored in the plurality of LUT entries, wherein the modification function is operable to approximate each of at least some input values of the LUT conversion function as either a power of 2 value or a combination of two or more power of 2 values.

4. The system of claim 1 wherein $k \geq 3$.

5. The system of claim 1 wherein $k=3$.

6. The system of claim 1 wherein the input signal is a complex signal having a real component and an imaginary component, and the plurality of input samples of the input signal is a plurality of input samples of the real component of the input signal or a plurality of input samples of the imaginary component of the input signal.

7. The system of claim 1 further comprising transmitter circuitry operable to upconvert, filter, and amplify the output signal prior to transmission, wherein the DPD system operates to compensate for a non-linear characteristic of a power amplifier comprised in the transmitter circuitry.

8. The system of claim 2 wherein the adaptor comprises:
an adaptation function operable to compute a desired DPD characteristic based on a comparison of the input signal and a feedback signal, the feedback signal being from an output of a respective power amplifier;
a LUT conversion function operable to, for each LUT entry, compute an initial LUT value for the LUT entry based on the desired DPD characteristic; and
an approximation function operable to, for each LUT entry, compute the first set of values $\{p_1, p_2, \ldots, p_k\}$ and the second set of values $\{s_1, s_2, \ldots, s_k\}$ for the LUT entry such that $s_1 \cdot 2^{P_1} + s_2 \cdot 2^{P_2} + \ldots + s_k \cdot 2^{P_k}$ is an approximation of the initial LUT value for the LUT entry.

9. The system of claim 1 wherein:
the DPD actuator comprises a plurality of memory tap branches each comprising a separate LUT, a separate select circuitry, and a separate approximate multiplication function; and
each output sample of the output signal is provided as a sum of output samples from the plurality of memory tap branches for a respective input sample of the input signal.

10. The system of claim 1 wherein the approximate multiplication function comprises:
a shifter;
an adder/subtractor; and
an accumulation register;
wherein the shifter, the adder/subtractor, and the accumulation register are controlled to generate and combine the shifted values in a serial manner in accordance with the first set of values $\{p_1, p_2, \ldots, p_k\}$ and the second set of values $\{s_1, s_2, \ldots s_k\}$ for the selected LUT entry.

11. The system of claim 1 wherein the system is a transmitter of a radio node in a cellular communications network.

12. A method for digitally predistorting an input signal to provide a predistorted output signal using a Digital Predistortion, DPD, actuator comprising a Look-Up Table, LUT, comprising a plurality of LUT entries, wherein each LUT entry comprises information that represents a first set of values $\{p_1, p_2, \ldots, p_k\}$ and a second set of values $\{s_1, s_2, \ldots s_k\}$ that together represent a LUT value of $s_1 \cdot 2^{P_1} + s_2 \cdot 2^{P_2} + \ldots + s_k \cdot 2^{P_k}$ where each value $s_i \in \{+1, -1\}$ for all $i=1, 2, \ldots, k$ and $k \geq 2$, comprising:
for each input sample of a plurality of input samples of the input signal:
selecting a LUT entry from among the plurality of LUT entries comprised in the LUT based on a value derived from the input sample that is indicative of a power of the input signal;

for each value $p_i$ in the first set of values $\{p_1, p_2, \ldots, p_k\}$ for the selected LUT entry, shifting a plurality of bits that form a binary representation of the input sample by $p_i$ bit positions to provide a respective shifted value; and combining the shifted values using additions and subtractions in accordance with signs defined by the second set of values $\{s_1, s_2, \ldots s_k\}$ to thereby provide a binary representation of an output sample that is an approximation of a multiplication of the input sample and a desired DPD value represented by the LUT entry.

13. The method of claim 12 further comprising adapting the plurality of LUT entries in the LUT.

14. The method of claim 13 wherein adapting the plurality of LUT entries in the LUT comprises:

generating input values based on a feedback signal;

approximating each of at least some of the input values as either a power of 2 value or a combination of two or more power of 2 values; and generating a plurality of initial LUT values to be approximated by the information stored in the plurality of LUT entries based on the at least some input values.

15. The method of claim 12 wherein k≥3.

16. The method of claim 12 wherein k=3.

17. The method of claim 12 wherein the input signal is a complex signal having a real component and an imaginary component, and the plurality of input samples of the input signal is a plurality of input samples of the real component of the input signal or a plurality of input samples of the imaginary component of the input signal.

18. The method of claim 12 further comprising:

in transmitter circuitry, upconverting, filtering, and amplifying the output signal prior to transmission;

wherein the DPD actuator applies a predistortion that compensates for a non-linear characteristic of a power amplifier comprised the transmitter circuitry.

19. The method of claim 13 wherein adapting the plurality of LUT entries in the LUT comprises:

computing a desired DPD characteristic based on a comparison of the input signal and a feedback signal, the feedback signal being from an output of a respective power amplifier;

for each LUT entry, computing an initial LUT value for the LUT entry based on the desired DPD characteristic; and for each LUT entry, computing the first set of values $\{p_1, p_2, \ldots, p_k\}$ and the second set of values $\{s_1, s_2, \ldots, s_k\}$ for the LUT entry such that $s_1 \cdot 2^{p_1} + s_2 \cdot 2^{p_2} + \ldots + s_k \cdot 2^{p_k}$ is an approximation of the initial LUT value for the LUT entry.

20. A User Equipment, UE, comprising:

a Digital Predistortion, DPD, system for digitally predistorting an input signal to provide a predistorted output signal, the DPD system comprising:

a DPD actuator comprising:

a Look-Up Table, LUT, comprising a plurality of LUT entries, wherein each LUT entry comprises information that represents a first set of values $\{p_1, p_2, \ldots, p_k\}$ and a second set of values $\{s_1, s_2, \ldots, s_k\}$ that together represent a LUT value of $s_1 \cdot 2^{p_1} + s_2 \cdot 2^{p_2} + \ldots + s_k \cdot 2^{p_k}$ where each value $s_i \in \{+1, -1\}$ for all $i = 1, 2, \ldots, k$ and $k \geq 2$;

select circuitry operable to, for each input sample of a plurality of input samples of the input signal, select a LUT entry from among the plurality of LUT entries comprised in the LUT based on a value derived from the input sample that is indicative of a power of the input signal; and an approximate multiplication function comprising shifting and combining circuitry that operates to, for each input sample of the plurality of input samples of the input signal:

for each value $p_i$ in the first set of values $\{p_1, p_2, \ldots, p_k\}$ for the selected LUT entry, shift a plurality of bits that form a binary representation of the input sample by $p_i$ bit positions to provide a respective shifted value; and combine the shifted values using additions and subtractions in accordance with signs defined by the second set of values $\{s_1, s_2, \ldots, s_k\}$ to thereby provide a binary representation of an output sample.

21. A radio access node comprising:

a Digital Predistortion, DPD, system for digitally predistorting an input signal to provide a predistorted output signal, the DPD system comprising:

a DPD actuator comprising:

a Look-Up Table, LUT, comprising a plurality of LUT entries, wherein each LUT entry comprises information that represents a first set of values $\{p_1, p_2, \ldots, p_k\}$ and a second set of values $\{s_1, s_2, \ldots, s_k\}$ that together represent a LUT value of $s_1 \cdot 2^{p_1} + s_2 \cdot 2^{p_2} + \ldots + s_k \cdot 2^{p_k}$ where each value $s_i \in \{+1, -1\}$ for all $i = 1, 2, \ldots, k$ and $k \geq 2$;

select circuitry operable to, for each input sample of a plurality of input samples of the input signal, select a LUT entry from among the plurality of LUT entries comprised in the LUT based on a value derived from the input sample that is indicative of a power of the input signal; and an approximate multiplication function comprising shifting and combining circuitry that operates to, for each input sample of the plurality of input samples of the input signal:

for each value $p_i$ in the first set of values $\{p_1, p_2, \ldots, p_k\}$ for the selected LUT entry, shift a plurality of bits that form a binary representation of the input sample by $p_i$ bit positions to provide a respective shifted value; and combine the shifted values using additions and subtractions in accordance with signs defined by the second set of values $\{s_1, s_2, \ldots, s_k\}$ to thereby provide a binary representation of an output sample.

* * * * *

UNITED STATES PATENT AND TRADEMARK OFFICE
CERTIFICATE OF CORRECTION

| | |
|---|---|
| PATENT NO. | : 11,405,004 B2 |
| APPLICATION NO. | : 16/972933 |
| DATED | : August 2, 2022 |
| INVENTOR(S) | : Jafri et al. |

It is certified that error appears in the above-identified patent and that said Letters Patent is hereby corrected as shown below:

In the Drawings

In Fig. 4, Sheet 4 of 12, for Step "412", in Line 1, delete "i≤k?" and insert -- i<k --, therefor.

In the Specification

In Column 1, below Title, insert -- This application is a 35 U.S.C. § 371 national phase filing of International Application No. PCT/EP2018/064727, filed June 5, 2018, the disclosure of which is incorporated herein by reference in its entirety. --.

In Column 1, Lines 26-27, delete "Third Generation Partnership (3GPP)" and insert -- Third Generation Partnership Project (3GPP) --, therefor.

In Column 12, Line 51, delete "$p_i$=6." and insert -- $p_1$=6. --, therefor.

In Column 14, Line 39, delete "own 2 selection" and insert -- own selection --, therefor.

In Column 14, Lines 41-42, delete "memory tap branches 2700-1 through 2700-M. The DPD actuator 2202" and insert -- memory tap branches 700-1 through 700-M. The DPD actuator 202 --, therefor.

In Column 14, Lines 42-43, delete "delays 7701-1 through 7701-(M-1)" and insert -- delays 701-1 through 701-(M-1) --, therefor.

In Column 14, Line 44, delete "702-(M-1)." and insert -- 702-2… --, therefor.

In Column 14, Lines 44-45, delete "memory tap branch 2700-1" and insert -- memory tap branch 700-1 --, therefor.

In Column 14, Line 47, delete "memory tap branch 2700-2" and insert -- memory tap branch 700-2 --, therefor.

Signed and Sealed this
Fourteenth Day of March, 2023

Katherine Kelly Vidal
*Director of the United States Patent and Trademark Office*

CERTIFICATE OF CORRECTION (continued)
U.S. Pat. No. 11,405,004 B2

In Column 14, Lines 48-49, delete "delay 7701-1" and insert -- delay 701-1 --, therefor.

In Column 14, Line 50, delete "memory tap branch 2701-M" and insert -- memory tap branch 700-M --, therefor.

In Column 14, Lines 51-52, delete "delay 7701-(M-1)" and insert -- delay 701-(M-1) --, therefor.

In Column 14, Lines 53-54, delete "memory tap branches 2700-1 through 2700-M" and insert -- memory tap branches 700-1 through 700-M --, therefor.

In Column 14, Line 54, delete "702-(M-1)" and insert -- 702-2 --, therefor.

In Column 14, Line 55, delete "DPD actuator 2202." and insert -- DPD actuator 202. --, therefor.

In the Claims

In Column 19, Line 39, in Claim 1, delete "$s_i \varepsilon \{+1, -1\}$" and insert -- $s_i \in \{+1, -1\}$ --, therefor.

In Column 20, Line 62, in Claim 12, delete "$s_i \varepsilon \{+1, -1\}$" and insert -- $s_i \in \{+1, -1\}$ --, therefor.